(12) United States Patent
Xie et al.

(10) Patent No.: US 11,011,638 B2
(45) Date of Patent: May 18, 2021

(54) TRANSISTOR HAVING AIRGAP SPACER AROUND GATE STRUCTURE

(71) Applicant: International Business Machines Corporation, Armonk, NY (US)

(72) Inventors: Ruilong Xie, Niskayuna, NY (US); Julien Frougier, Albany, NY (US); Kangguo Cheng, Schenectady, NY (US); Chanro Park, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 66 days.

(21) Appl. No.: 16/550,793

(22) Filed: Aug. 26, 2019

(65) Prior Publication Data
US 2021/0066489 A1    Mar. 4, 2021

(51) Int. Cl.
*H01L 29/78*    (2006.01)
*H01L 29/06*    (2006.01)
(Continued)

(52) U.S. Cl.
CPC ........ *H01L 29/785* (2013.01); *H01L 29/0653* (2013.01); *H01L 29/41791* (2013.01);
(Continued)

(58) Field of Classification Search
CPC ............. H01L 29/785; H01L 29/41791; H01L 29/66795; H01L 2029/7858; H01L 2924/0002; H01L 2924/00; H01L 21/76805; H01L 21/76885; H01L 23/485; H01L 21/76224; H01L 21/7682;
(Continued)

(56) References Cited

U.S. PATENT DOCUMENTS

| 5,869,379 A | 2/1999 | Gardner et al. |
| 7,741,663 B2 | 6/2010 | Hause et al. |

(Continued)

OTHER PUBLICATIONS

Cheng, K., et al., "Air Spacer for 10nm FinFET CMOS and Beyond," 2016, IEEE, pp. IEDM16-444-IEDM16-447.
(Continued)

*Primary Examiner* — Didarul A Mazumder
(74) *Attorney, Agent, or Firm* — Cantor Colburn LLP; Joseph Petrokaitis

(57) ABSTRACT

An integrated semiconductor device having a gate structure adjacent to a semiconductor body at a channel region, the channel region being positioned laterally between source/drain regions. Metal plugs are on the source/drain regions, and rectangular-shaped or trapezoidal-shaped plug caps are above and immediately adjacent to the metal plugs. A self-aligned metal filled contact (CA) is conductively coupled to one of the metal plugs on the source and drain regions, and a self-aligned metal filled contact (CBoA) is conductively coupled to the gate structure. The device further includes a low k dielectric layer that includes a continuous airgap having an inverted u-shape formed about the gate structure and breaks at about a portion of the gate structure including the self-aligned metal filled contact (CBoA). Also, methods for forming the device including the uniquely shaped continuous airgap are disclosed.

20 Claims, 26 Drawing Sheets

(51) Int. Cl.
*H01L 29/41* (2006.01)
*H01L 29/66* (2006.01)
*H01L 29/49* (2006.01)
*H01L 29/417* (2006.01)

(52) U.S. Cl.
CPC ...... *H01L 29/4975* (2013.01); *H01L 29/4983* (2013.01); *H01L 29/66795* (2013.01); *H01L 2029/7858* (2013.01)

(58) Field of Classification Search
CPC ............. H01L 29/4991; H01L 29/6653; H01L 29/6656; H01L 23/5222–5225; H01L 21/764; H01L 21/76897
USPC ............................................ 257/365; 438/284
See application file for complete search history.

(56) References Cited

U.S. PATENT DOCUMENTS

| | | | |
|---|---|---|---|
| 9,368,572 B1 * | 6/2016 | Cheng | H01L 27/1248 |
| 9,716,158 B1 | 7/2017 | Cheng et al. | |
| 9,721,897 B1 * | 8/2017 | Cheng | H01L 21/02126 |
| 9,735,246 B1 | 8/2017 | Basker et al. | |
| 9,859,166 B1 | 1/2018 | Cheng et al. | |
| 10,026,824 B1 | 7/2018 | Chanemougame et al. | |
| 10,128,334 B1 | 11/2018 | Bourjot et al. | |
| 2004/0097065 A1 * | 5/2004 | Lur | H01L 21/7682 438/619 |
| 2009/0023279 A1 * | 1/2009 | Kim | H01L 21/764 438/594 |
| 2012/0104512 A1 * | 5/2012 | Horak | H01L 29/6653 257/401 |
| 2014/0035147 A1 * | 2/2014 | Lee | H01L 21/76877 257/762 |
| 2015/0243544 A1 | 8/2015 | Alptekin et al. | |
| 2017/0148662 A1 * | 5/2017 | Ok | H01L 21/76805 |
| 2018/0033863 A1 | 2/2018 | Xie et al. | |
| 2018/0130899 A1 * | 5/2018 | Zhang | H01L 29/7851 |
| 2018/0138279 A1 * | 5/2018 | Xie | H01L 29/4991 |

OTHER PUBLICATIONS

Sachid, A., et al., "FinFET With Encases Air-Gap Spacers for High-Performance and Low-Energy Circuits," Jan. 1, 2017, IEEE Electron Device Letters, vol. 38, No. 1, pp. 16-20.

* cited by examiner

TRANSISTOR HAVING AIRGAP SPACER AROUND GATE STRUCTURE

BACKGROUND

The present invention generally relates to fabrication methods and resulting structures for semiconductor devices. More specifically, the present invention relates to field effect transistors (FETs) that include fins (FinFETs) while reducing parasitic capacitance and protecting trench silicide plugs when building in the insulating airgaps.

Semiconductor device manufacturing technology continues to evolve toward the direction of enabling further shrinkage of the footprint and/or size of devices, such as, for example, transistors. As a result, structure-related parasitic characteristics of these devices are becoming increasingly significant in influencing and sometimes determining application of these devices. For example, capacitance that can be found in the form of gate-to-source or gate-to-drain greatly impacts operational speed of a transistor, energy consumption of any integrated circuit (IC) that makes use of that transistor, and other aspects of performance. In general, gate-to-source or gate-to-drain capacitance is affected, and determined, by the size of gate contacts, source contacts, and drain contact, as well as the characteristics (e.g., dielectric constant) of the dielectric material between the gate and the source/drain contact. For example, in a conventional FinFET, the dielectric material can include, among other elements, spacers at the sidewalls of the gate. Insulating selected regions of the device can reduce the parasitic capacitance.

SUMMARY

According to a non-limiting embodiment of the present invention, a method for forming a device structure includes forming an opening including a lower portion and a trapezoidal-shaped upper portion in a first sacrificial cap material to a source and drain region. The lower portion is metallized to form metal plugs conductively coupled to the source and drain regions. The trapezoidal-shaped upper portion is filled with a second sacrificial cap material, A self-aligned contact opening (CA) is formed to at least one of the metal plugs over a source and drain region and a self-aligned contact opening over an active area to a gate structure (CBoA). The self-aligned contact opening is metallized to the form CA and CBoA contacts conductively coupled to the source and drain regions, and the gate structure, respectively. The first sacrificial cap material is selectively removed to the source and drain regions; and a low k dielectric material is deposited to form a continuous airgap extending from between sidewalls and above the gate structure.

Embodiments of the present invention are further directed to an integrated circuit structure. A non-limiting example of the integrated circuit structure includes a gate structure adjacent to a semiconductor body at a channel region, the channel region being positioned laterally between source/drain regions. Metal plugs are on the source/drain regions. Trapezoidal-shaped plug caps are above and immediately adjacent to the metal plugs. A self-aligned metal filled contact (CA) is conductively coupled to one of the metal plugs on the source and drain regions, and a self-aligned metal filled contact over an active area (CBoA) is conductively coupled to the gate structure. A low k dielectric layer including a continuous airgap having an inverted u-shape form is about the gate structure and breaks at about a portion of the gate structure including the CBoA.

In one or more aspects of the present invention, a non-limiting example of the integrated circuit structure includes a gate structure adjacent to a semiconductor body at a channel region, the channel region being positioned laterally between source/drain regions. Metal plugs are on the source/drain regions. Rectangular-shaped plug caps are above and immediately adjacent to the metal plugs. A self-aligned metal filled contact (CA) conductively is coupled to one of the metal plugs on the source and drain regions. A self-aligned metal filled contact over an active area (CBoA) is between adjacent rectangular shaped plug caps conductively coupled to the gate structure in the active region. A dielectric spacer is provided including a continuous airgap having an inverted u-shape formed about the gate structure when the rectangular-shaped plug caps are adjacent to one another and breaks at an edge of the active area and about a portion of the gate structure including the self-aligned metal filled contact (CBoA).

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings.

Figure 1:
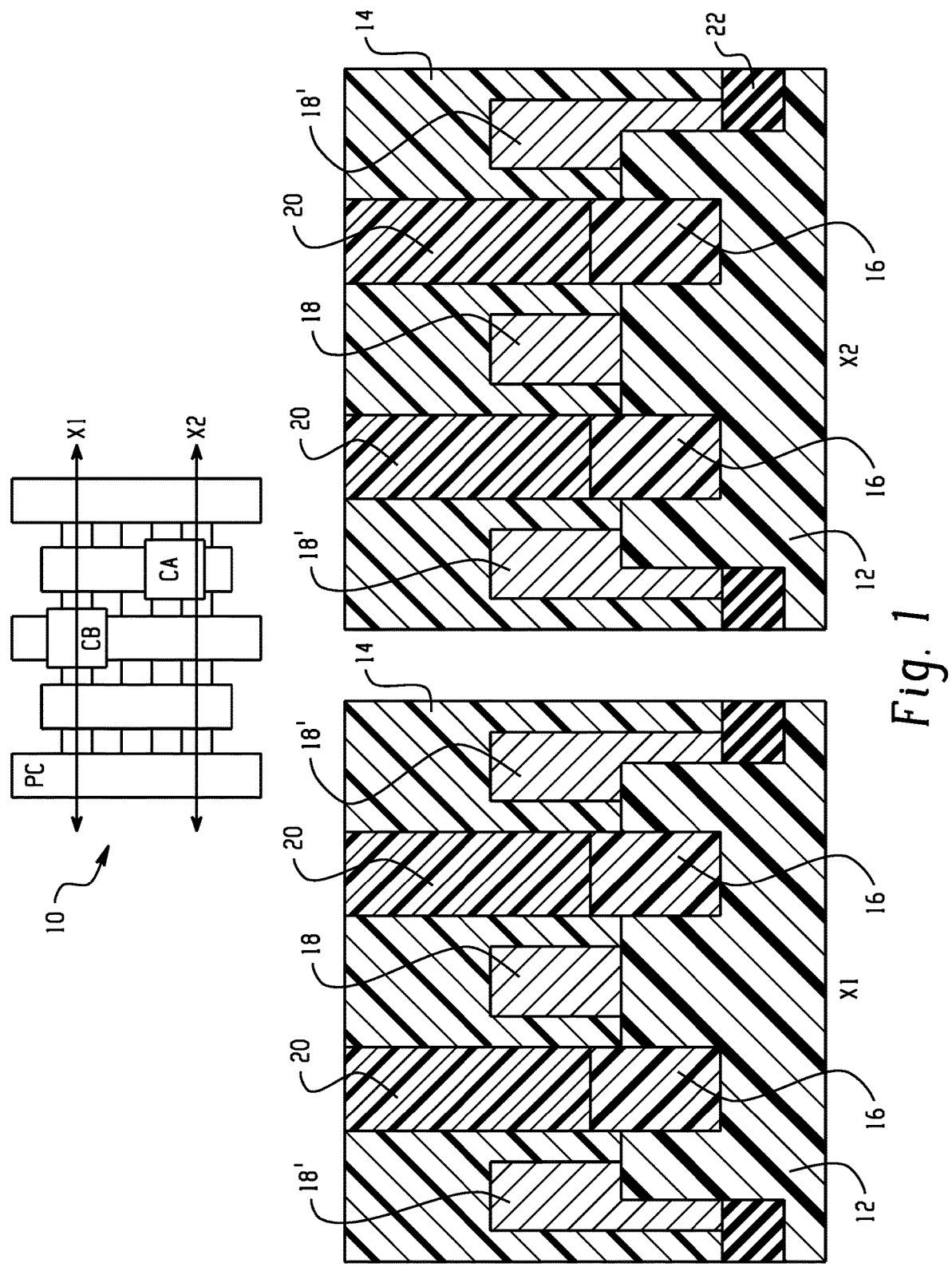
FIG. 1 depicts a top plan view and cross-sectional views taken along lines X1 and X2 where the source and drain contact (CA) and gate contact (CB) will be formed and illustrating a partial transistor structure subsequent to self-aligned contact (SAC) cap formation in accordance with one or more embodiments of this invention.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

Semiconductor device manufacturing technology continues to evolve further shrinkage of the footprint and/or size of devices (e.g., transistors). As a result, structure related parasitic characteristics of these smaller devices are influencing and sometimes determining the application of these devices. For example, capacitance that can be found in the form of gate-to-source or gate-to-drain can significantly impact operational speed of a transistor, energy consumption of any IC that makes use of that transistor, and other aspects of performance. In general, gate-to-source or gate-to-drain capacitance is affected and determined by the size of the gate and/or source and drain contact as well as the characteristics of the dielectric material, represented typically by its dielectric constant, between the gate and the source and drain contact. For example, in a conventional field-effect-transistor (FET), the dielectric material can include, among others, spacers at the sidewalls of the gate. However, the processing employed to add insulation can harm other device components, such as a high dielectric constant material (high k material) that is part of a replacement metal gate structure, e.g., a gate structure formed in replacement of a sacrificial gate structure. For example, in taking steps to improve the insulating characteristics, processing near the gate can lead to the exposure of and damage to high k material situated around the metal gates.

In embodiments of the present invention, the spacer materials can be formed in the trenches, both before and after metal deposition, the presence of which can shape the metal formation, i.e., metal contacts, and upon removal provide for air gap formation with pinch off regions. In one or more embodiments of the invention, a spacer material is deposited in the space between the replacement metal gate structures and the metal materials for the source and drain contacts as well as in the space above the gate structures (i.e., SAC cap material) that is produced by removing sacrificial material, in which the sacrificial material forms a pinch off seal preventing further spacer material from entering the space. The pinch off seal produced by the sacrificial material leaves a continuous air gap in the space between the replacement metal gates and the metallization formations, e.g., metal contacts, and the cap space providing the continuous air gap insulation in addition to insulation that can be provided by other materials, e.g., low k dielectric spacer material formed in conformance to the walls of the replacement metal gate and metallization formations. A maximum reduction in parasitic capacitance is obtained with the continuous airgap formed about the gate structures. Moreover, the shape of the sacrificial TS cap serves to protect the metal plugs (CA) to the source and drain regions during fabrication operations to form the gate contact (CB).

The low k dielectric spacer material can have a dielectric constant of up to about 3, meaning a dielectric constant of greater than zero up to about 3, such as a dielectric constant ranging from about 1.5 to about 3.0, and in one or more embodiments, can have a dielectric constant of less than about 2.5.

Further, generally IC structures have middle of the line (MOL) contacts that connect the semiconductor devices to back end of the line (BEOL) metal levels. For example, a FinFET can have a gate contact (a CB contact) and source and drain contacts (CA contacts). The gate contact (CB) can extend vertically through interlayer dielectric (ILD) material from a metal wire or via in the first back end of the line (BEOL) metal level to the gate of the FinFET. The source and drain contacts (CA) can extend vertically through ILD material from metal wires or vias in the BEOL metal level to metal plugs (TS contacts), which are on the source and drain regions of the FinFET. Generally, in order to avoid shorts and reduce the resistance between the gate contact and the metal plugs, the gate contact (CB) is formed on a portion of the gate that is offset from the active region of the FinFET and, more particularly, on a portion of the gate that extends laterally over the adjacent isolation region. However, given the need for size scaling of devices, it is advantageous to provide a gate contact to be formed on a portion of the gate directly above the active region (referred to herein as a CB-over-active or CBoA) that reduces the resistance. Reducing contact resistance can greatly improve the performance of advanced FinFETs. Unfortunately, the techniques used to form a FET with an air-gap gate sidewall spacer are currently incompatible with the techniques used to form a FET with CBoA, i.e., a gate contact over an active region. Thus, methods and structures are desired for reducing the contact resistance by providing a continuous airgap in the self-aligned contact (SAC) cap above the gate structures and the spacer between the gate structures and the metal plugs (TS) for the source and drain with metal plug (TS) protection to the CA contacts that is CBoA compatible.

In view of the foregoing, disclosed herein are integrated circuit (IC) structures having one or more transistors, each with a continuous airgap in the space provided by the SAC cap and spacer, and a gate contact over an active region (i.e., a CBoA). In the methods, a gate with a sacrificial gate cap material and a sacrificial gate sidewall spacer can be formed on a channel region and metal plugs with plug caps can be formed on source/drain regions. The sacrificial cap material and sacrificial gate sidewall spacer can be selectively removed, and a low k dielectric layer can be deposited forming the continuous airgap. During formation of a source and drain contact openings for a source and drain contact (CB), the sacrificial cap material is provided with a sloped opening over the source and drain regions and filled with a cap material. The sloped opening filled with the cap material protects the metal plug during patterning and metallization of the gate contact. Thus, the gate contact can be formed over an active region without risk of shorting to an adjacent metal plug. Also disclosed herein are the resulting IC structures formed according to such methods.

Turning now to an overview of the aspects of the invention, one or more embodiments of the invention address the above-described shortcomings of the prior art by providing at least one transistor structure and a method of forming the at least one transistor structure, which generally includes forming a continuous airgap in the SAC cap and spacer with CBoA with TS protection, and a structure configuration that could easily generate large continuous airgaps, without any concerns of subway issues and compatibility with CBoA. As will be described in greater detail below, the resulting airgap shape is continuous across the spacer and gate cap to achieve maximum capacitance benefits. In contrast, the prior art transistor structures and methods form the airgap only in the lower portion of the spacer, i.e., about the sidewalls, which is markedly different in terms of structure and methods for fabrication and is generally incompatible with CBoA formation.

The structures and methods described herein can be used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a (100) orientated crystalline surface can take on a (100) orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

Referring now to the drawings in which like numerals represent the same or similar elements and in particular FIGS. 1-10, there are depicted fabrication operations in accordance with one or more embodiments of this invention to form a continuous airgap with TS (i.e., metal plug) protection that is compatible with CBoA (i.e., gate contact over an active region). In FIG. 1, a plan view and cross-sectional views are shown of a partially constructed integrated circuit 10 including at least one transistor device after deposition of a self-aligned contact (SAC) cap material. The cross-sectional views depicted in the drawings are taken where indicated in the plan view shown in FIG. 1. More specifically, X1 is a cross-sectional view taken through a fin channel structure above an active region where a CB contact structure will be formed whereas X2 is a cross-sectional view taken through a fin channel structure where a CA contact structure of the source and drain regions will be formed.

The partially constructed device 10 generally includes one or more fins 12 formed in a semiconductor substrate, three of which are shown in the plan view and one of which is shown in the cross-sectional views. It should be noted that the particular number of fins 12 is not intended to be limited to that shown, which can vary in number depending on the number of transistors being formed. For example, the disclosed methods could be used to form non-planar FinFET(s), multi-fin finFET(s), FET(s) of different type conductivities, and the like.

In one or more embodiments, the fins 12 can be been etched into a substrate. The fins 12 as well as the substrate can include a monocrystalline silicon, although other suitable substrate materials can be employed such as, for example, a semiconductor-on-insulator wafer (e.g., a silicon-on-insulator (SOI) wafer) that includes a semiconductor substrate (e.g., a silicon substrate), an insulator layer (e.g., a buried oxide (BOX) layer or other suitable insulator layer on the semiconductor substrate) and a semiconductor layer (e.g., a silicon layer or other suitable semiconductor layer) on the insulator layer. Alternatively, a bulk semiconductor wafer (e.g., a bulk silicon wafer or other suitable bulk semiconductor wafer) could be used.

In general, the partially constructed IC device 10 after SAC cap 14 formation generally includes source and drain regions 16, gate structures 18, 18', and an interlayer dielectric 20 overlying the source and drain regions 16.

The source and drain regions 16 can be raised relative to the fin 12 and formed of an epitaxial semiconductor material. The device 10 can further include shallow trench isolation regions 22 formed in the substrate to electrically isolate the transistors 10 from adjacent devices. Other layers of material, such as contact etch stop layers, and the like, are not depicted in the drawings.

The SAC cap 14 can be composed of a dielectric material, such as an oxide, nitride or oxynitride material, that is suitable for sacrifice, e.g., at a later time in the process flow described herein. Removal of the sacrificial material can be made with a suitable etch process, which can be a wet etch or a dry etch depending on the material to be removed relative to other materials. In one or more embodiments, the SAC cap 14 can be a silicon oxynitride, e.g., SiNO, or can be a silicon boron carbon nitride (SiBCN) material.

The epitaxial semiconductor material (often referred to as "epi") defining the source and drain regions (S/D) 16 can be silicon, germanium, a silicon-germanium (SiGe) alloy, carbon doped silicon (Si:C), combinations thereof, or the like. By way of example, the epitaxial semiconductor material defining the source and drain regions 16 can be SiGe. The SiGe layer can be formed, for example, by a selective epitaxial process using a combination of silicon-containing gas, a germanium-containing gas, a carrier gas, and optionally, an etchant gas. The silicon containing gas can be a gas such as silane ($SiH_4$), dichlorosilane ($SiH_2Cl_2$), disilane ($Si_2H_6$), trisilane ($Si_3H_8$) or tetrasilane ($Si_4H_{10}$). The germanium containing gas can be a gas such as germane ($GeH_4$) or digermane ($Ge_2H_6$). The carrier gas can be a gas such as nitrogen, hydrogen, or argon. The optional etchant gas can be a gas such as hydrogen chloride (HCl) or chlorine ($Cl_2$). The formation can occur at a temperature ranging from about 450° C. to about 900° C. The SiGe layer can have a Ge concentration of about 15% to about 100%, preferably from about 20% to about 60%. It should be apparent that in the case of a PFET S/D epi, the semiconductor material can be heavily doped with p-type dopants, such as B whereas for NFET S/D epi, the semiconductor material can be heavily doped with n-type dopants, such as P, As, and the like.

The gate electrodes outside the active area can be defined by a replacement metal gate structure 18' shown passing over the fins 12. A sacrificial gate structure can previously be formed from polycrystalline silicon, and then replaced with the replacement metal gate structure 18' in a gate last configuration after other aspects of the device are formed, for example, after the source and drain regions 16 are formed by epitaxial growth.

The replacement metal gate (RMG) structures 18' can include a gate metal material, such as tungsten (W); a work function metal, such as titanium nitride (TiN); and a gate dielectric material, such as a high-k gate dielectric. The term "high-k" as used to describe the material of the gate dielectric layer denotes a dielectric material having a dielectric constant greater than silicon oxide ($SiO_2$) at room temperature (20° C. to 25° C.) and atmospheric pressure (1 atm). For example, a high-k dielectric material can have a dielectric constant greater than 4.0. In another example, the high-k gate dielectric material has a dielectric constant greater than 7.0. In one or more embodiments, the gate dielectric material is composed of a high-k oxide, such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the gate dielectric material include hafnium silicate, hafnium silicon oxynitride or combinations thereof.

It is noted that titanium nitride (TiN) is only one example of a metal containing material that can be used for the work function metal. Other examples of work function metals for the replacement metal gate (RMG) gate structures include ruthenium, titanium aluminum, aluminum nitride, and tantalum carbide.

It is noted that tungsten (W) is only one example of a composition that can provide the gate metal material. In other embodiments, the gate metal material can be tantalum (Ta), aluminum (Al), platinum (Pt), gold (Au), silver (Ag), copper (Cu) and alloys thereof.

The ILD material 20 can be selected from silicon containing materials such as $SiO_2$, $Si_3N_4$, $SiO_xN_y$, SiC, SiCO, SiCOH, and SiCH compounds, with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon (α-C:H)). Additional choices for the ILD material include any of the aforementioned materials in porous form, or in a form that changes during processing to or from being porous and/or permeable to being non-porous and/or non-permeable.

Figure 2:
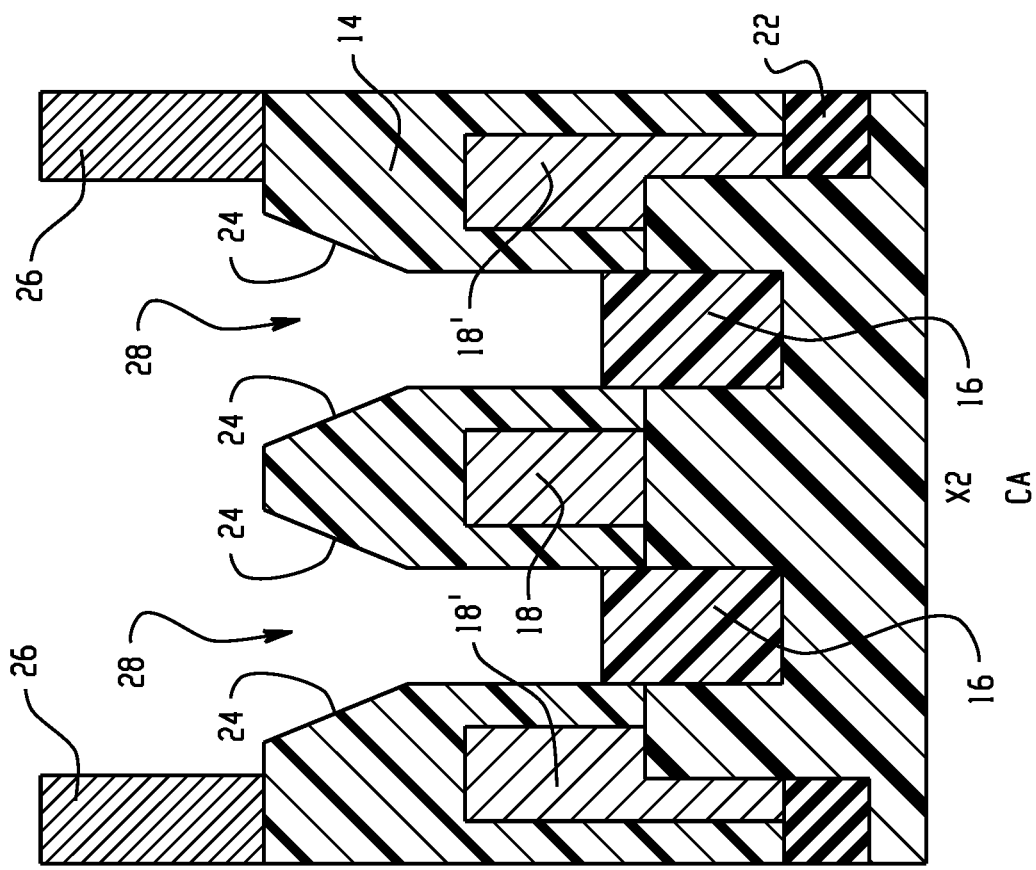
FIG. 2 depicts the cross-sectional views X1 and X2 of FIG. 1 after a metal plug (i.e., trench silicide, (TS)) etch process in accordance with one or more embodiments of this invention.
Figure 2:
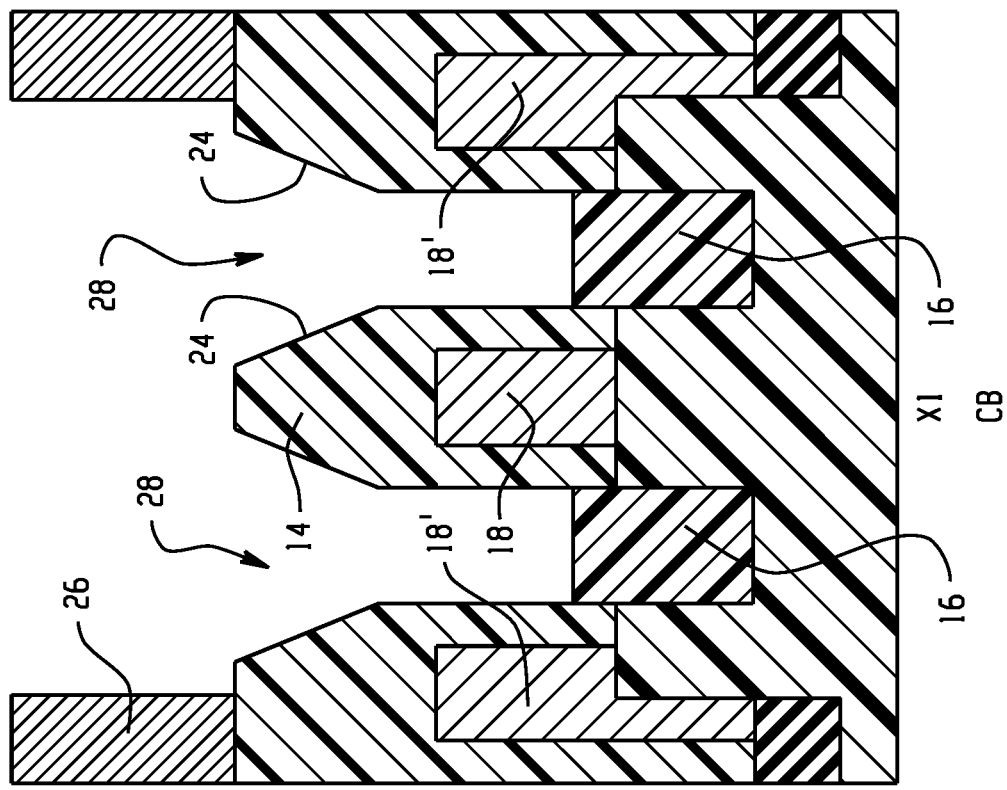

FIG. 2 illustrate the partially constructed device 10 after a directional etch process such as a reactive ion etch process to selectively expose the uppermost surfaces of the source and drain regions 16 for subsequent metal plug (TS) formation, wherein the reactive ion etch process is configured to create sloped sidewalls 24 in the SAC cap layer 14 in the top portion about the opening to the source and drain regions 16. That is, the TS reactive ion etch process is configured for a directional etch to selectively remove the interlayer dielectric 20 to the source and drain regions 16 and form opening 28 to reveal a top surface of the source and drain regions 16 in the fin regions 12. The directional etching is selective to remove the interlayer dielectric 20 relative to the SAC cap material 14 and is tuned to purposely create sloped walls 24 corresponding to corner loss of the SAC cap material 14 at about the opening 28. The sloped sidewalls 24 provide the opening 28 with a width that is greater than the width of the exposed source and drain regions 16.

The reactive ion etching can include first depositing a mask including an organic planarizing (or patterning) layer (OPL) 26 (or organic dielectric layer (ODL)) over a top surface of the device 10 after deposition of the SAC cap 14.

The OPL 26 is patterned using a mask (silicide contact mask or TS mask) to form the opening 28 to the source and drain regions 16 as shown. In one or more embodiments, on top of OPL, the litho stack can include a silicon anti-reflective coating (SiARC) (not shown) and/or a photo-sensitive organic polymer including a light-sensitive material that, when exposed to electromagnetic (EM) radiation, is chemically altered and thus configured by the mask (not shown) to be removed using a developing solvent. For example, the photo-sensitive organic polymer can be polyacrylate resin, epoxy resin, phenol resin, polyamide resin, polyimide resin, unsaturated polyester resin, polyphenylenether resin, polyphenylenesulfide resin, poly(methyl methacrylate) or benzocyclobutene (BCB). The exemplary organic planarization layer (OPL) can be replaced or substituted by any other known or unknown patterning methodology used to determine the placement of the source/drain regions 16.

Figure 3:
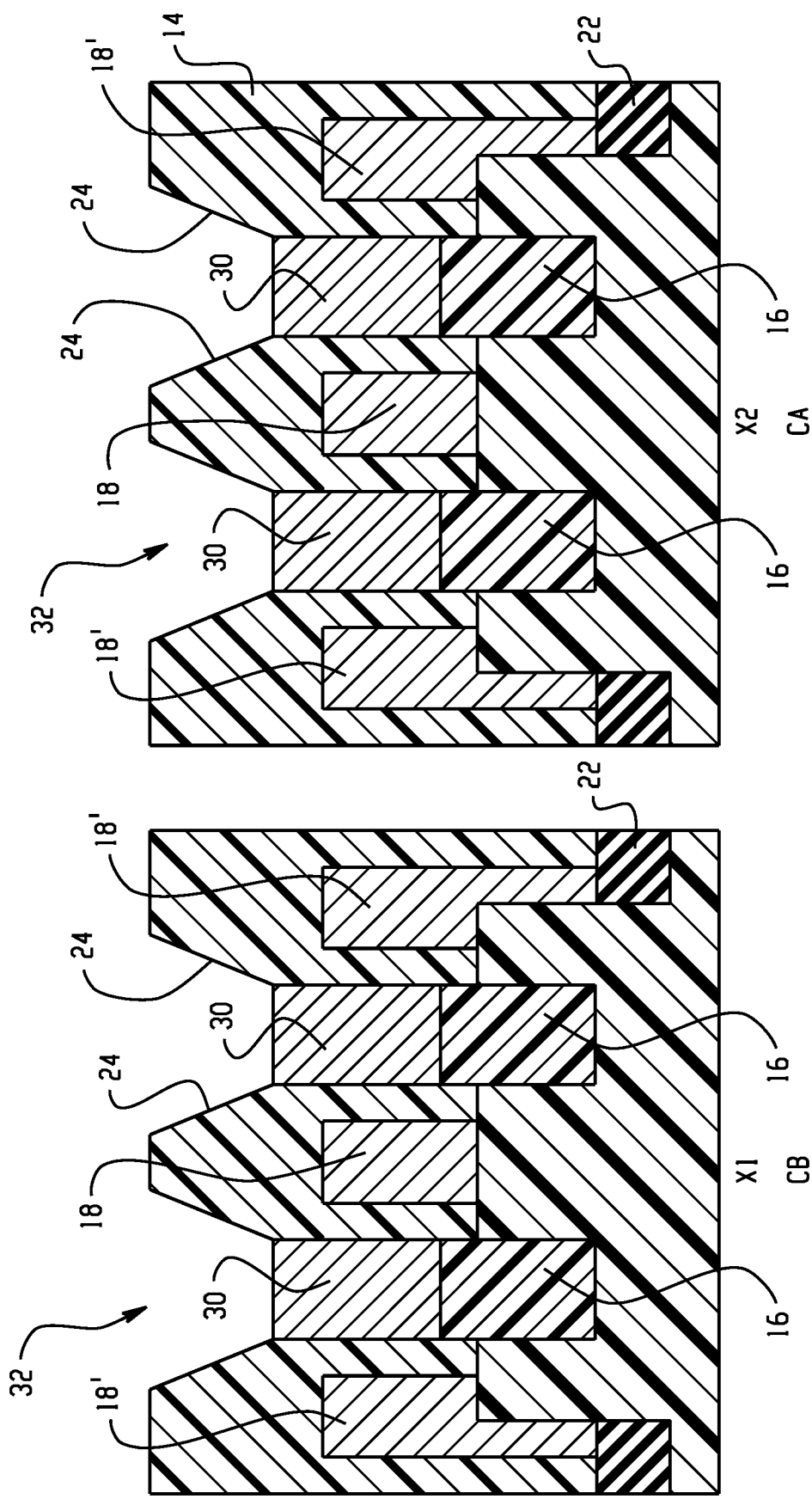
FIG. 3 depicts the cross-sectional views X1 and X2 of FIG. 2 after TS plug metallization, planarization, and recess formation above the metallized TS plug in accordance with one or more embodiments of this invention.

FIG. 3 illustrates the device 10 subsequent to formation of metal plugs 30 (i.e., a trench silicide) to the source/drain regions 16, which generally includes metallization, chemical mechanical planarization, and formation of a trapezoidal-shaped recess 32 above the metal plugs 30. It should be apparent that the trench silicide (TS) metal plug 30 can be slightly higher or lower than an inflection point of the sloped walls 24 defined in the SAC cap material 14.

Figure 4:
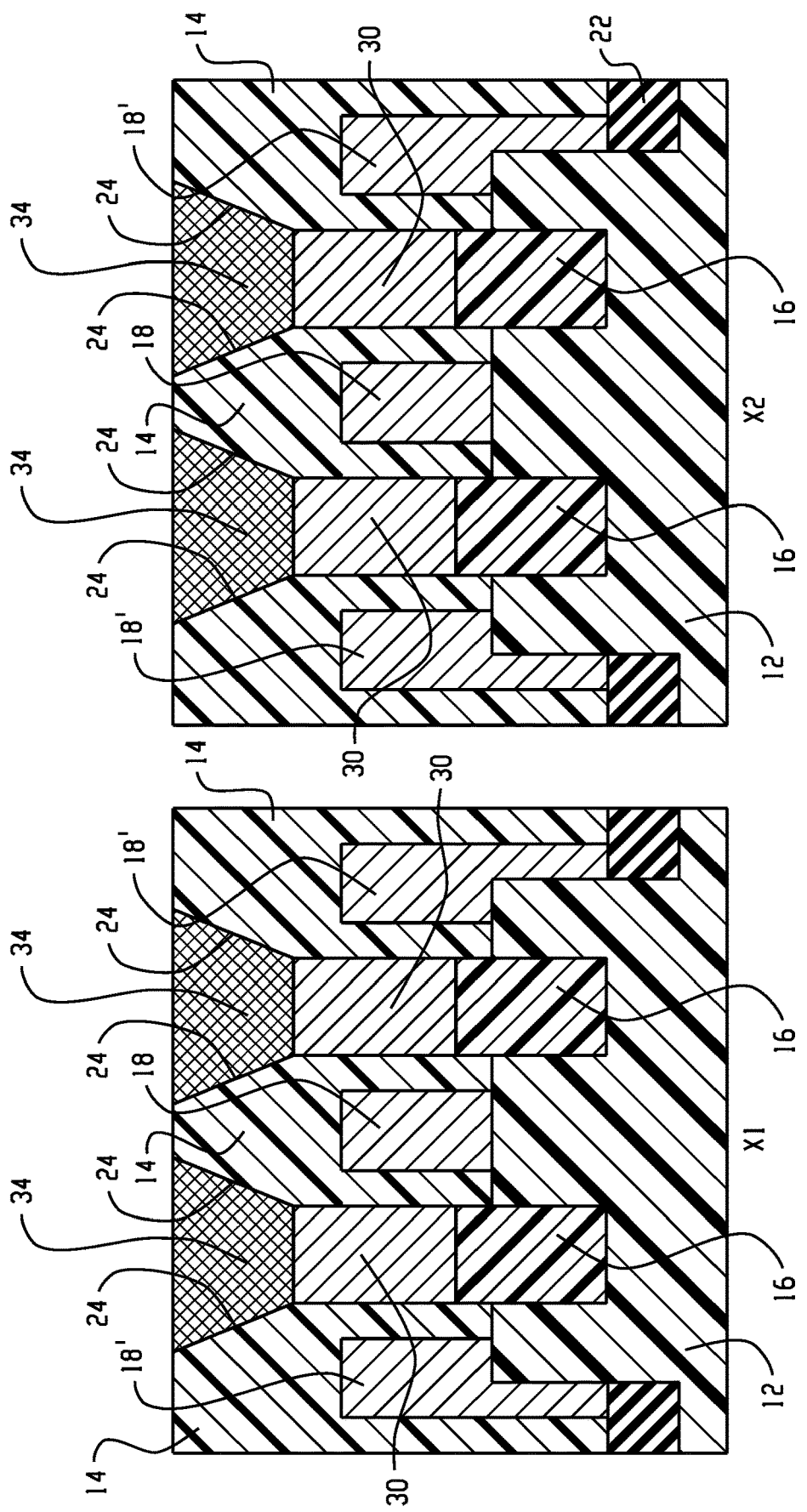
FIG. 4 depicts the cross-sectional views X1 and X2 of FIG. 3 after recess fill above the metallized TS plug and planarization in accordance with one or more embodiments of this invention.

FIG. 4 illustrates the device 10 subsequent to TS cap fill (e.g., SiC) of recess 32 followed by planarization, e.g., chemical mechanical planarizing, to provide the device with a planar surface. Deposition of the SiC to fill the recess 32 results in a SiC filled trapezoidal-shape 34. The SiC filled trapezoidal-shape 34 functions as a sacrificial cap to the metal plug 30, provides for formation of the self-aligned contacts (CB) to the gate structures 18 as well as the source and drain contacts (CA), and also advantageously serves to protect the metal plugs (TS) 30 during subsequent processing to form the CA and CB contacts.

Figure 5:
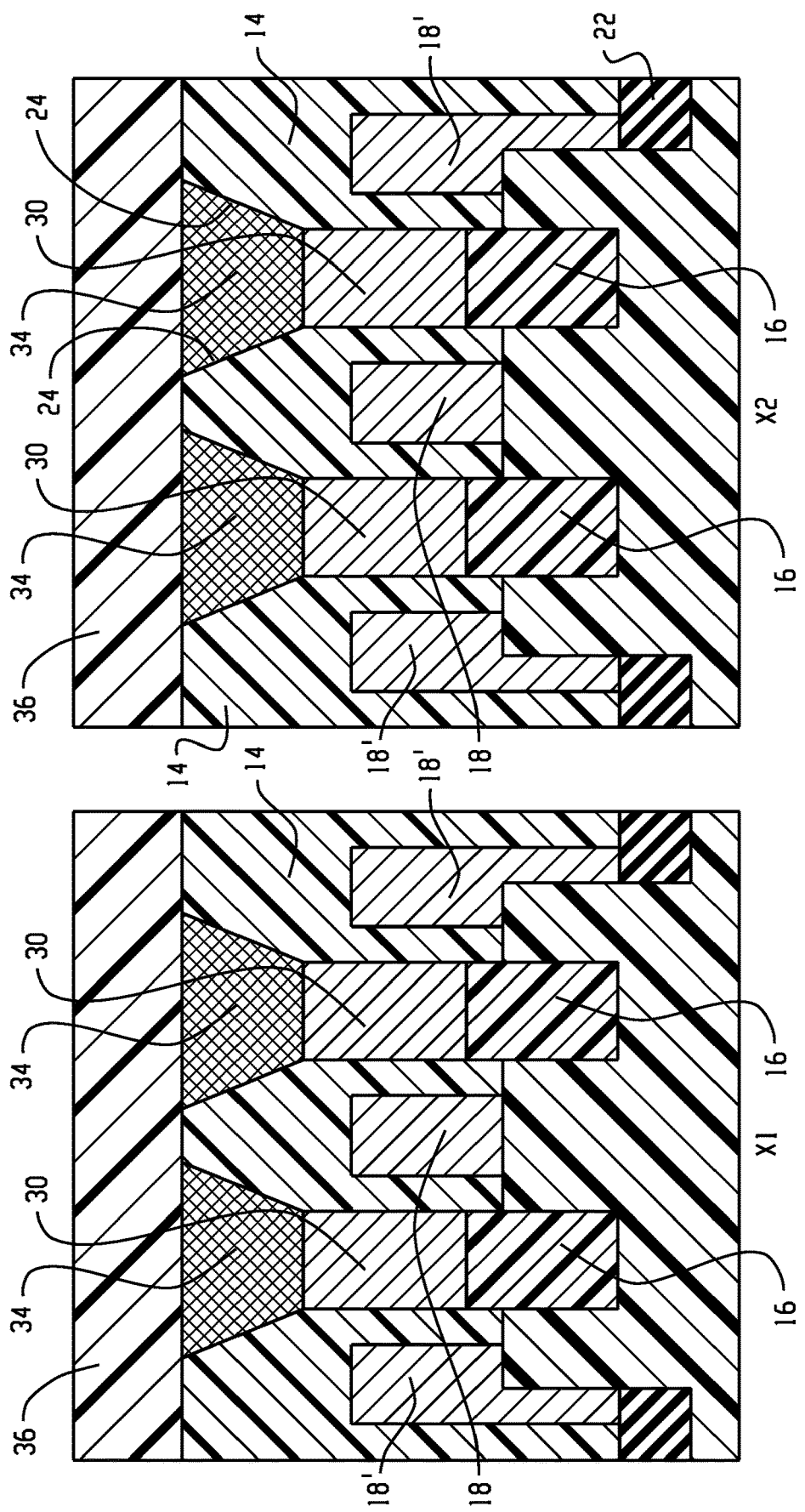
FIG. 5 depicts the cross-sectional views X1 and X2 of FIG. 4 after deposition of a sacrificial interlayer dielectric in accordance with one or more embodiments of this invention.

FIG. 5 illustrates the transistor device 10 after deposition of a sacrificial interlayer dielectric 36 (note that 36 can also be non-dielectric material) onto the planarized surface of the transistor device 10.

Figure 6:
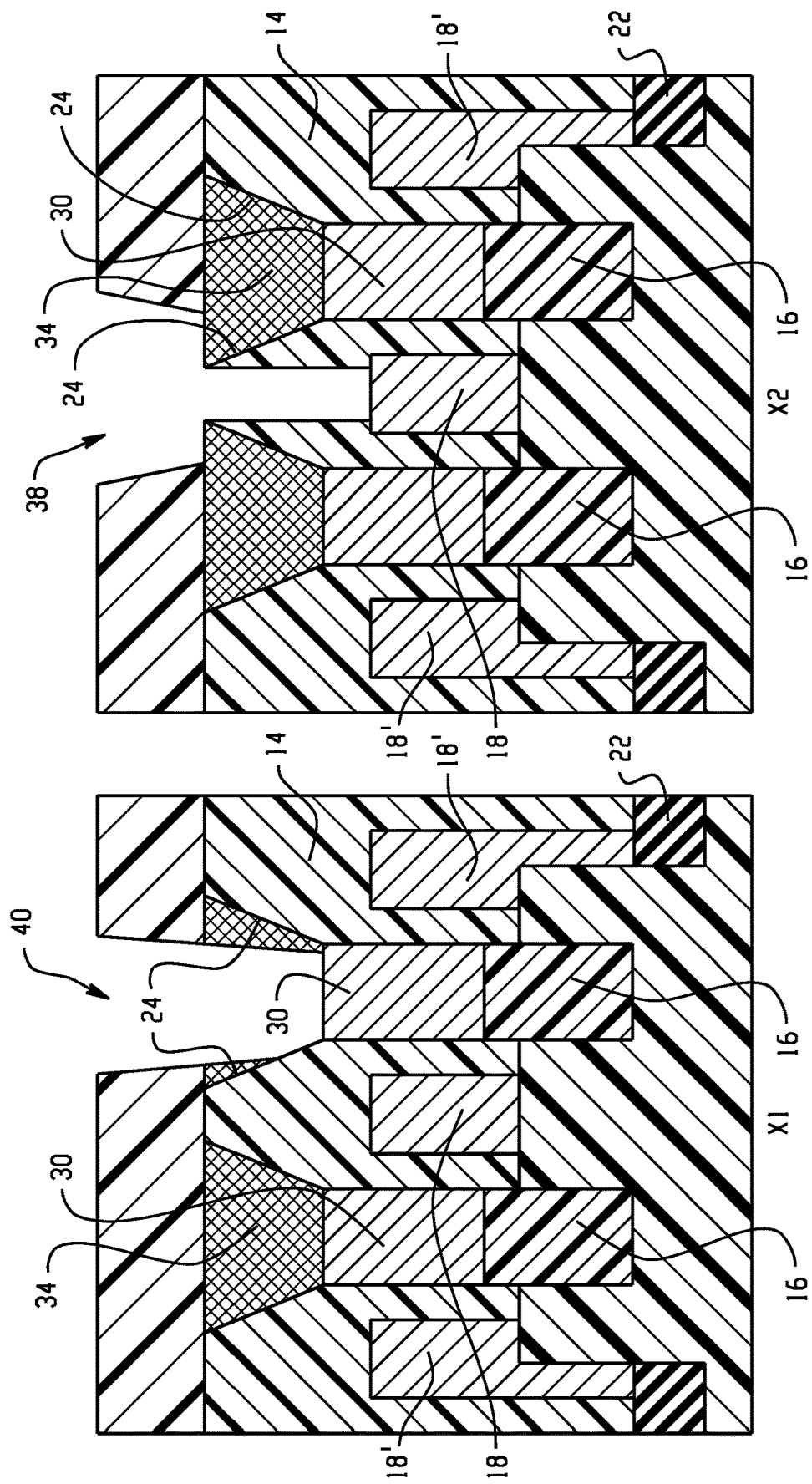
FIG. 6 depicts the cross-sectional views X1 and X2 of FIG. 5 after self-aligned patterning of openings corresponding to CA and CB in accordance with one or more embodiments of this invention.

In FIG. 6, the sacrificial interlayer dielectric 36 is lithographically patterned and etched to form the self-aligned contact openings 38, 40 for forming the gate contact CB and the source drain contact CA, respectively. With regard to contact opening 38, the etch process is a directional etch and is selective to remove an exposed portion of the interlayer dielectric 36 and SAC cap material 14 to form the gate contact (CB) opening 38 so as to expose the gate electrode 18, which is located intermediate the source and drain regions 16. The contact opening 38 is self-aligned by the trapezoidal shaped SiC cap 34 positioned on the adjacent metal plugs (TS) 30.

Regarding opening 40 for defining the source/drain contact CA, the etch process is also a directional etch and is selective to remove an exposed portion of the interlayer dielectric 36 and the SiC cap material 34 to form the gate contact (CA) opening 38 so as to expose the metal plug 30. Advantageously, the presence of the trapezoidal shaped SiC cap 34 permits the contact opening 40 to be offset relative to the underlying metal plug 30, if desired.

Figure 7:
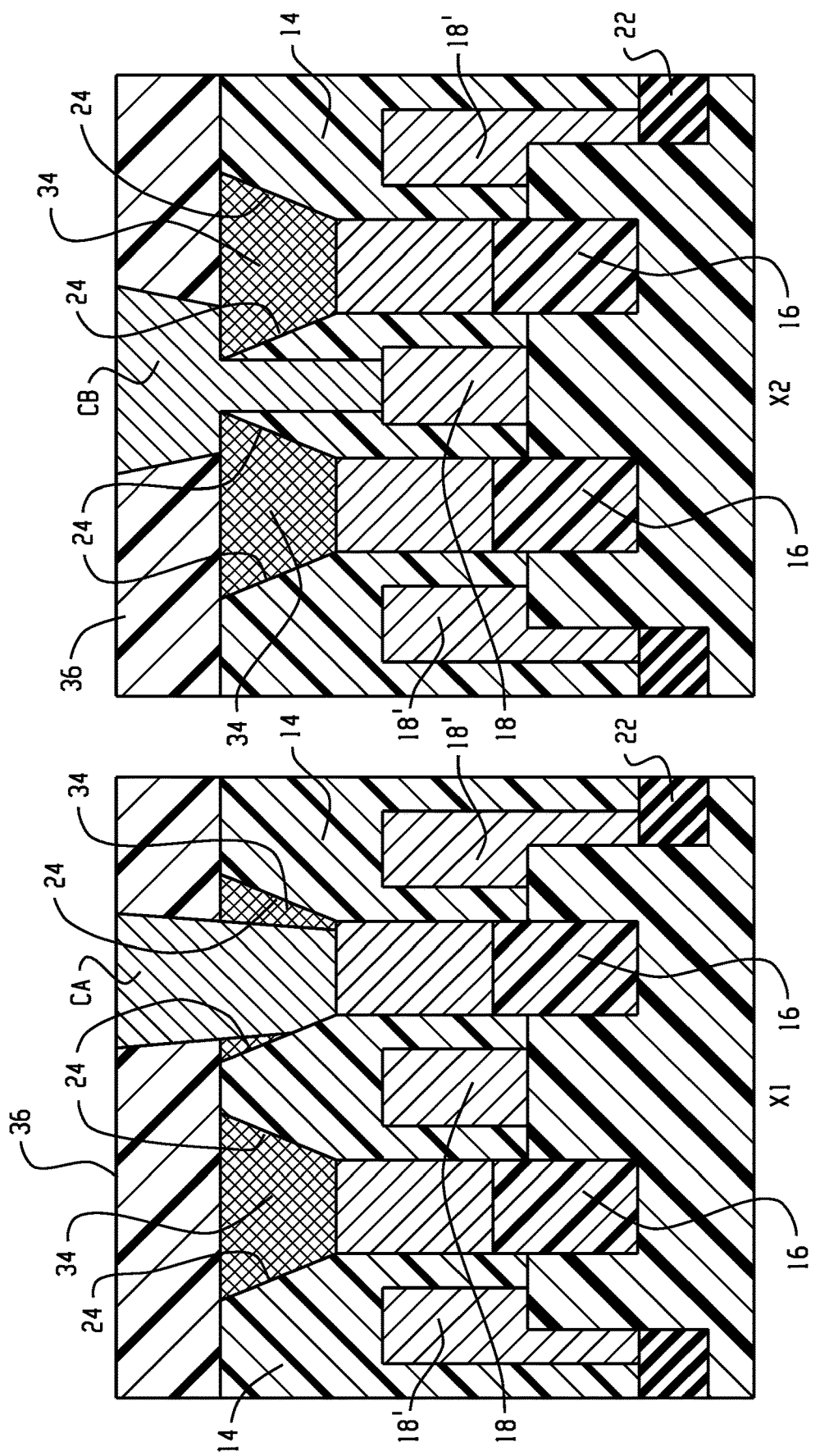
FIG. 7 depicts the cross-sectional views X1 and X2 of FIG. 6 after metallization of the openings corresponding to CA and CB in accordance with one or more embodiments of this invention.

In FIG. 7, the openings 38, 40 are metallized to form the source and drain contact (CA) and the gate electrode contact (CB). The particular metal is not intended to be limited and can be ruthenium, tungsten, cobalt, copper or combination of metals or the like.

Figure 8:
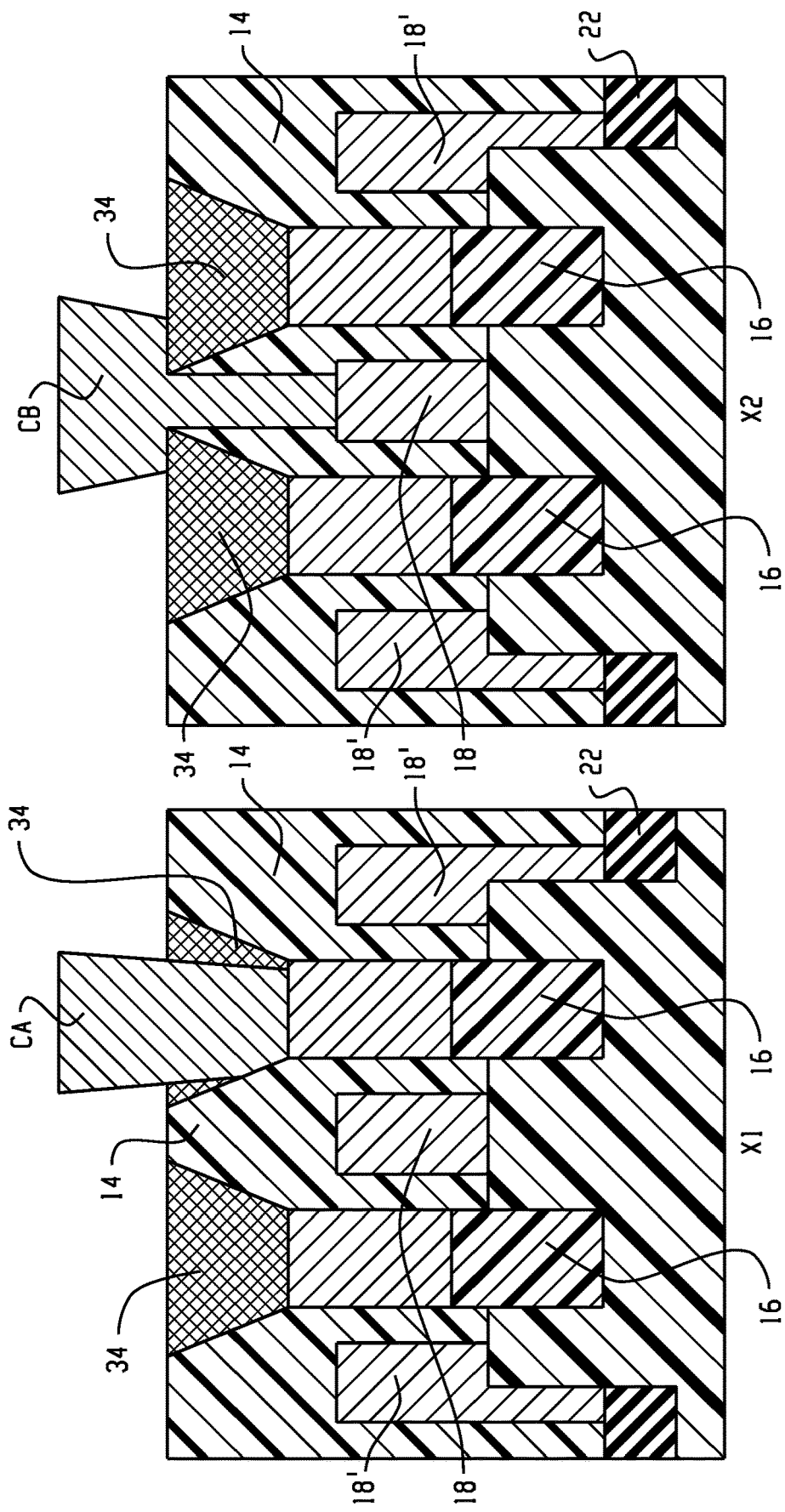
FIG. 8 depicts the cross-sectional views X1 and X2 of FIG. 7 after removal of the sacrificial interlayer dielectric in accordance with one or more embodiments of this invention.

FIG. 8 illustrates a cross sectional view of the transistor device 10 subsequent to sacrificial interlayer dielectric material removal.

Figure 9:
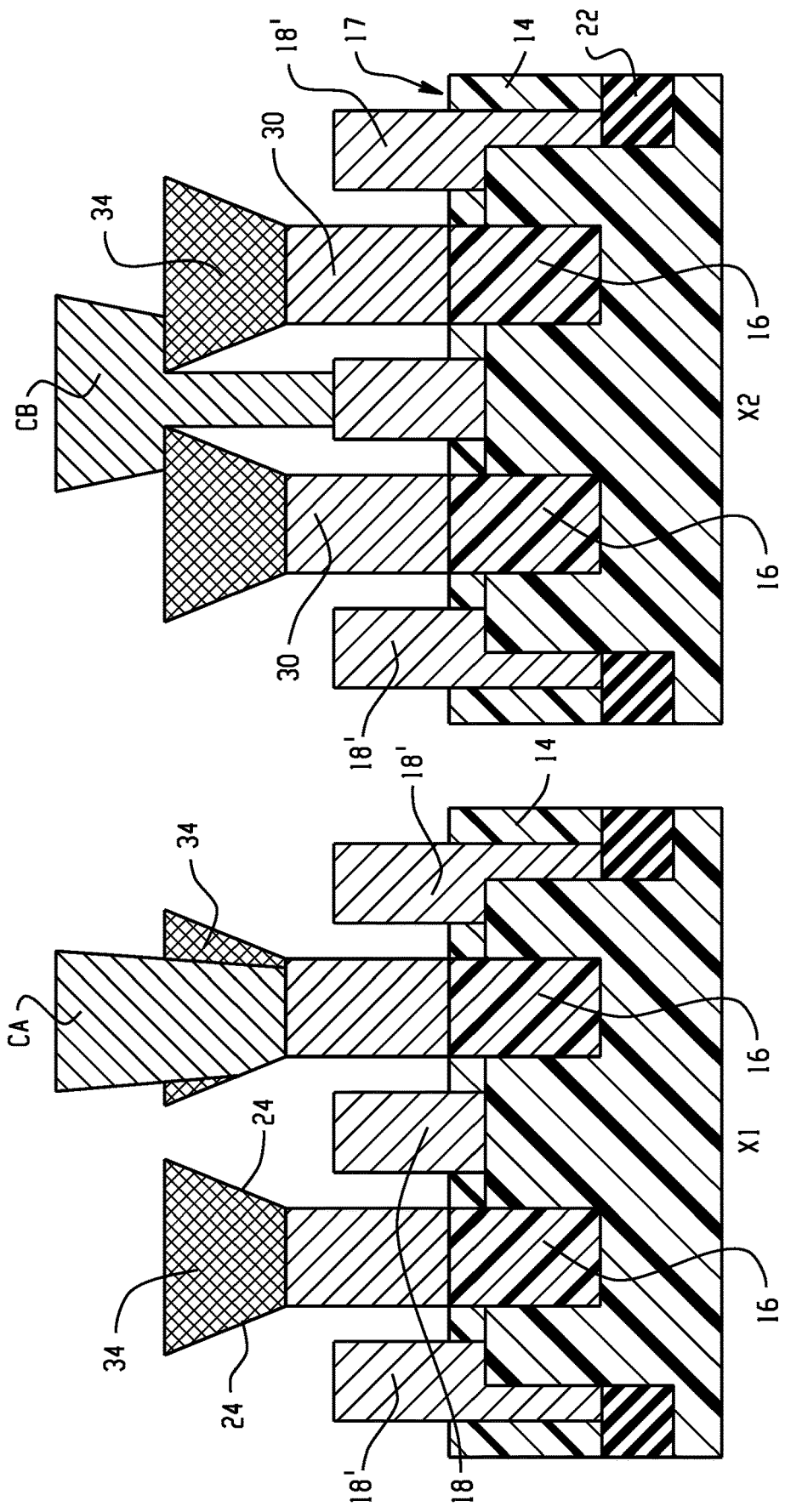
FIG. 9 depicts the cross-sectional views X1 and X2 of FIG. 8 after selective removal of the SAC cap material in accordance with one or more embodiments of this invention.

FIG. 9 illustrates a cross sectional view of the transistor device 10 subsequent to SAC cap and spacer 14 removal to the source and drain regions 16 so as to form a bottom spacer layer 17. As shown, the trapezoidal shaped SiC cap helps protect the metal plug (TS) 30 during selective removal of the SAC cap material 14, which can be a nitride such as silicon nitride.

Figure 10:
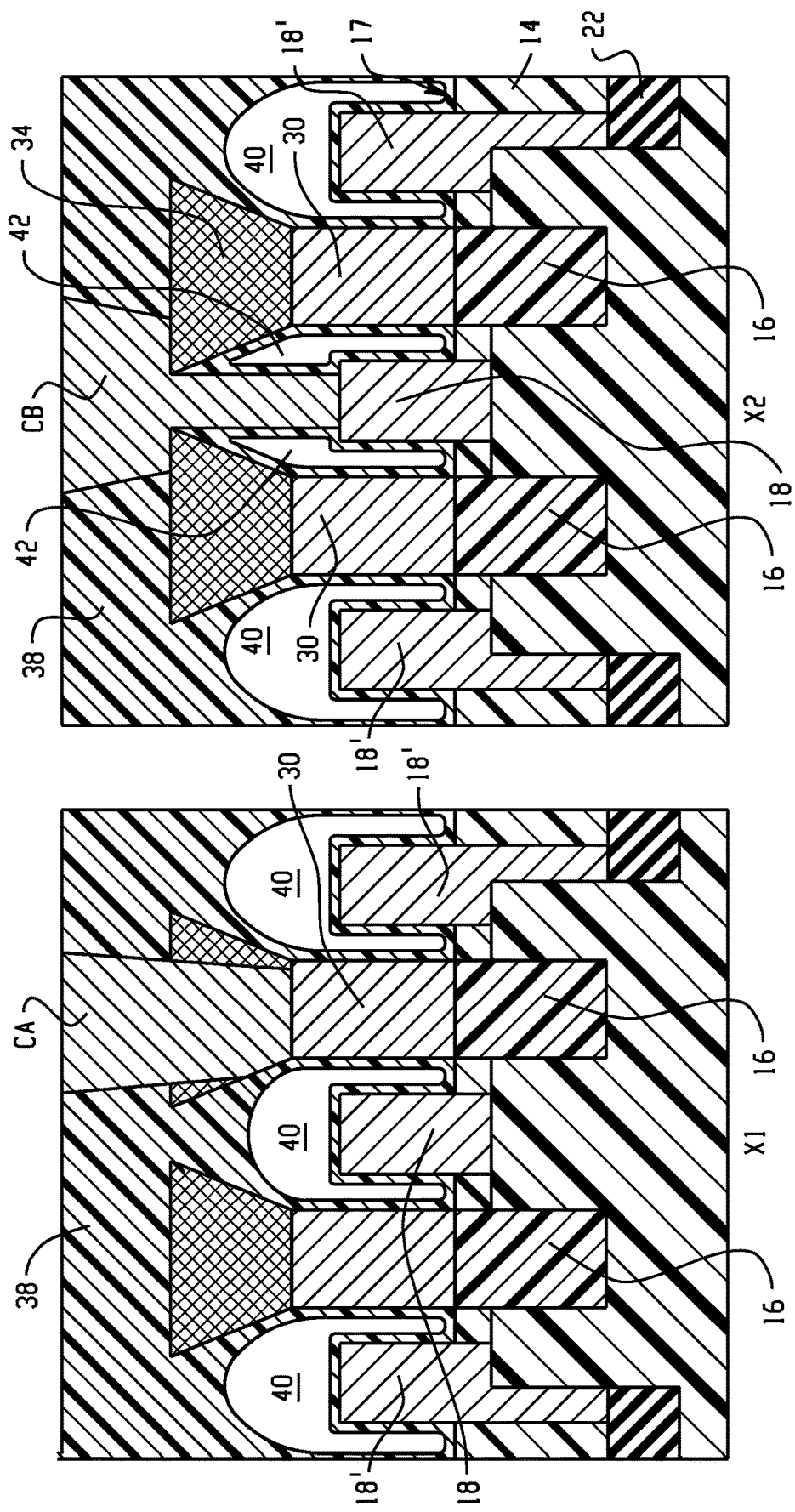
FIG. 10 depicts the cross-sectional views X1 and X2 of FIG. 9 after low k dielectric deposition and formation of a continuous airgap in the SAC cap and sidewall spacers in accordance with one or more embodiments of this invention.

In FIG. 10, a low k dielectric material 38 is deposited and subsequently planarized to the contact gate (CB) and the contact source/drain (CA) using a chemical mechanical planarizing process to form a planar surface. The deposition process is configured to provide pinch off such that a continuous airgap 40 is formed in the sidewall spacer between the replacement gate electrodes 18' and the metal plugs 30 as well as over the replacement gate electrodes 18'. The small and re-entrant opening helps airgap formation for the SAC cap and spacer. In the active region, the airgap 42 breaks in the gate contact 18 as shown. The presence of the continuous airgap about the replacement gate electrodes 18, and the discontinuous airgap about the gate contact 18 over the active area (CBoA) maximizes parasitic capacitance reduction.

Referring now to FIGS. 11-18, there are depicted fabrication operations to form the continuous airgap in accordance with one or more alternative embodiments of this invention subsequent to the partial fabrication of the transistor device 10 previously shown in FIG. 4.

Figure 11:
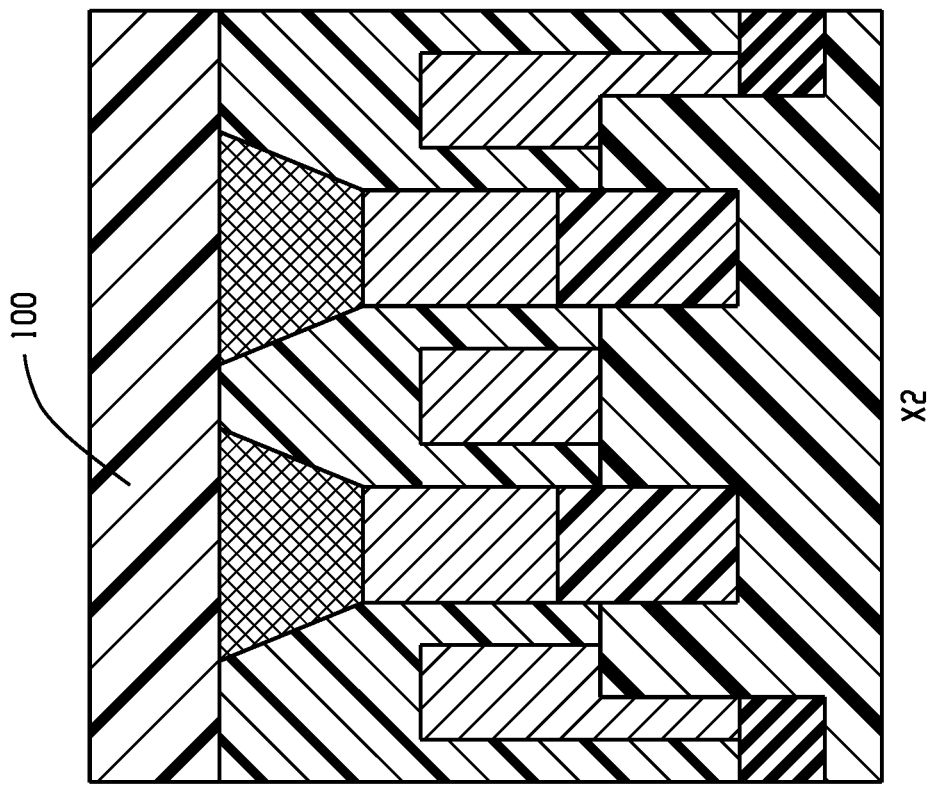
FIG. 11 depicts the cross-sectional views X1 and X2 of FIG. 4 after deposition of an interlayer dielectric in accordance with one or more embodiments of this invention in accordance with one or more embodiments of this invention.
Figure 11:
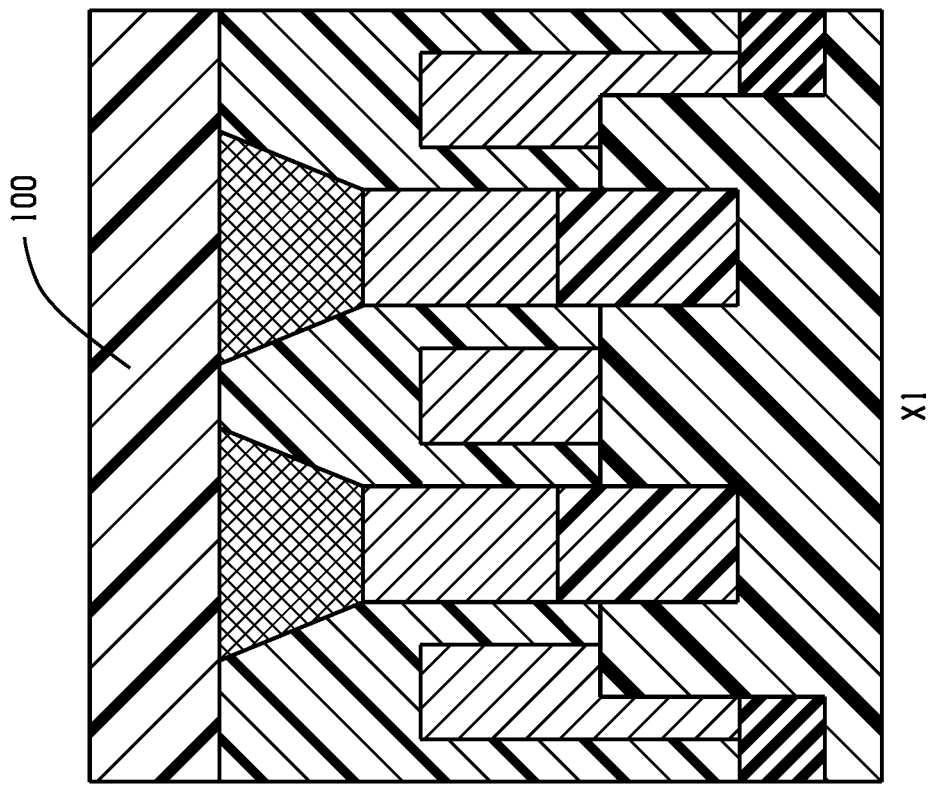

FIG. 11 depicts an interlayer dielectric layer 100 deposited onto the planarized surface of the transistor device 10 of FIG. 4.

Figure 12:
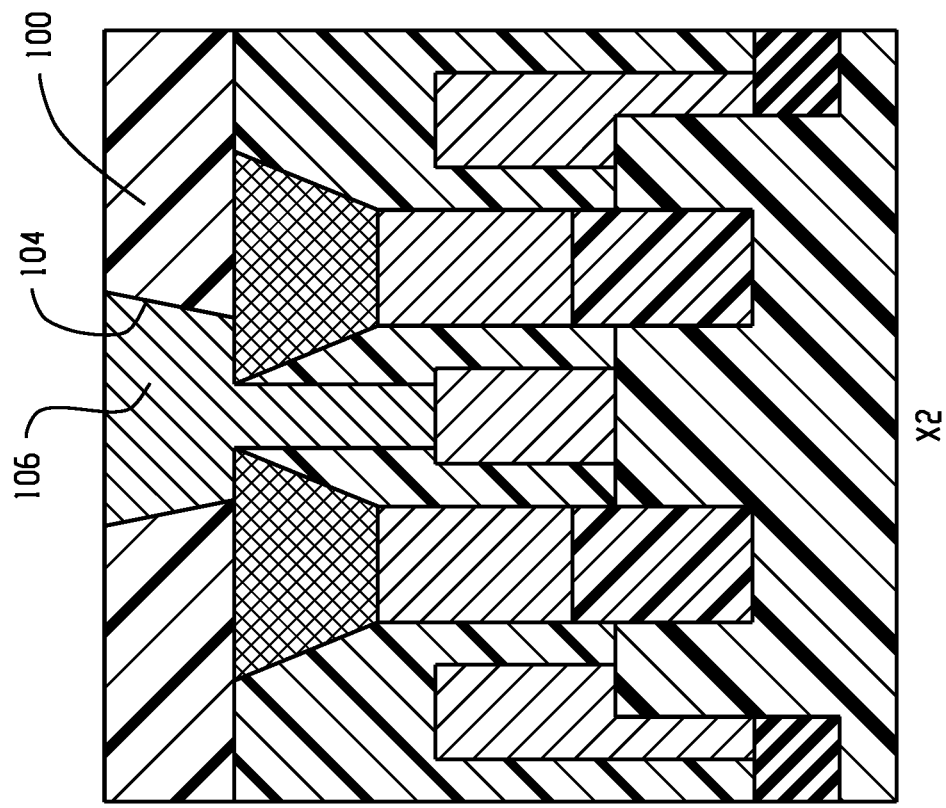
FIG. 12 depicts the cross-sectional views X1 and X2 of FIG. 11 after self-aligned patterning of openings corresponding to CA and CB and fill with a sacrificial material in accordance with one or more embodiments of this invention in accordance with one or more embodiments of this invention.
Figure 12:
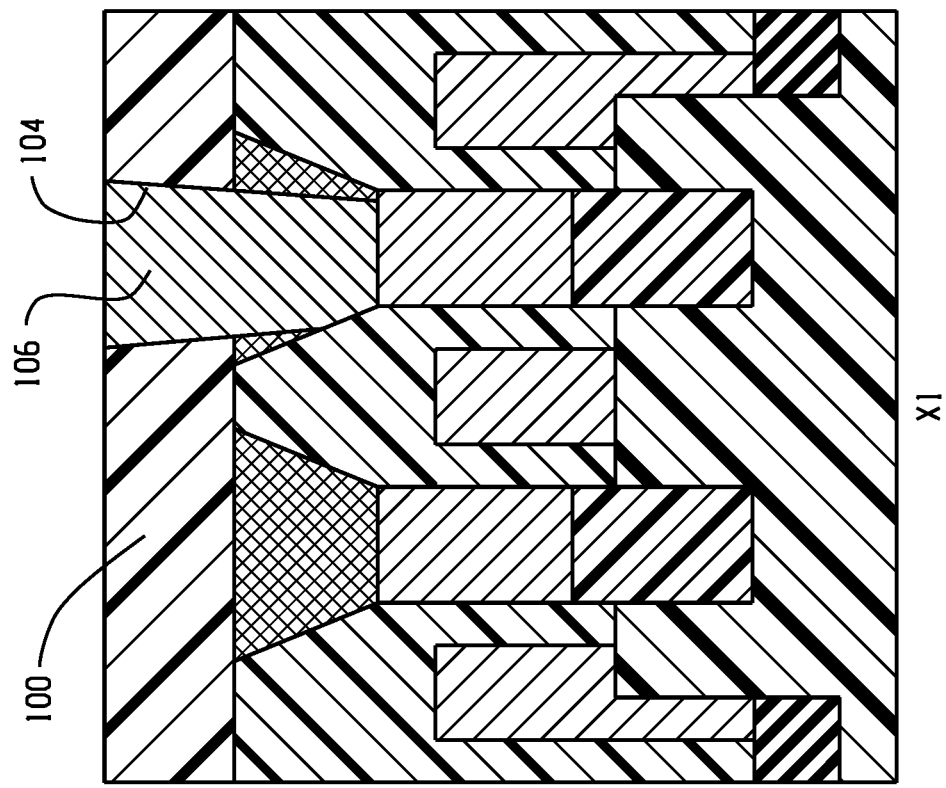

In FIG. 12, the interlayer dielectric 100 is lithographically patterned and etched to form the self-aligned contact openings for forming the gate contact CB and the source drain contact CA, respectively, which are subsequently filled with a sacrificial material 106. The contact openings can be formed using a directional etch as previously described (see the related description of FIG. 6 above). As shown, the contact openings are self-aligned to the gate electrode 18 and at least one of the source and drain regions 16 because of the trapezoidal-shaped SiC cap 34 on the metal plugs 30 that are coupled to source and drain regions 16.

Figure 13:
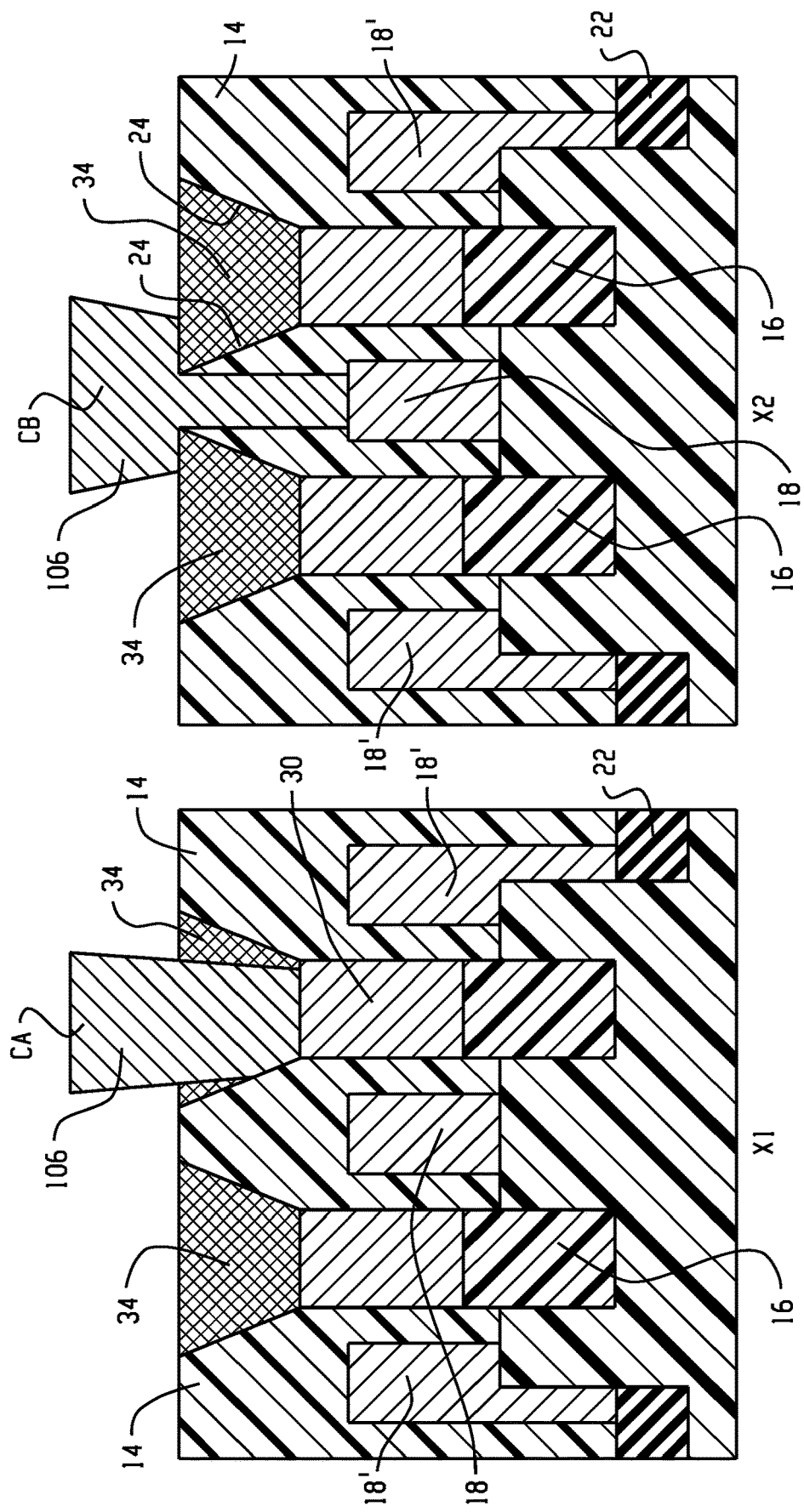
FIG. 13 depicts the cross-sectional views X1 and X2 of FIG. 12 after selective removal of the interlayer dielectric in accordance with one or more embodiments of this invention.

FIG. 13 illustrates a cross sectional view of the transistor device 10 subsequent to selective removal of the interlayer dielectric 100 relative to the sacrificial material filled openings defining the CA and CB contacts, the SiC cap 34, and the SAC cap material 14.

Figure 14:
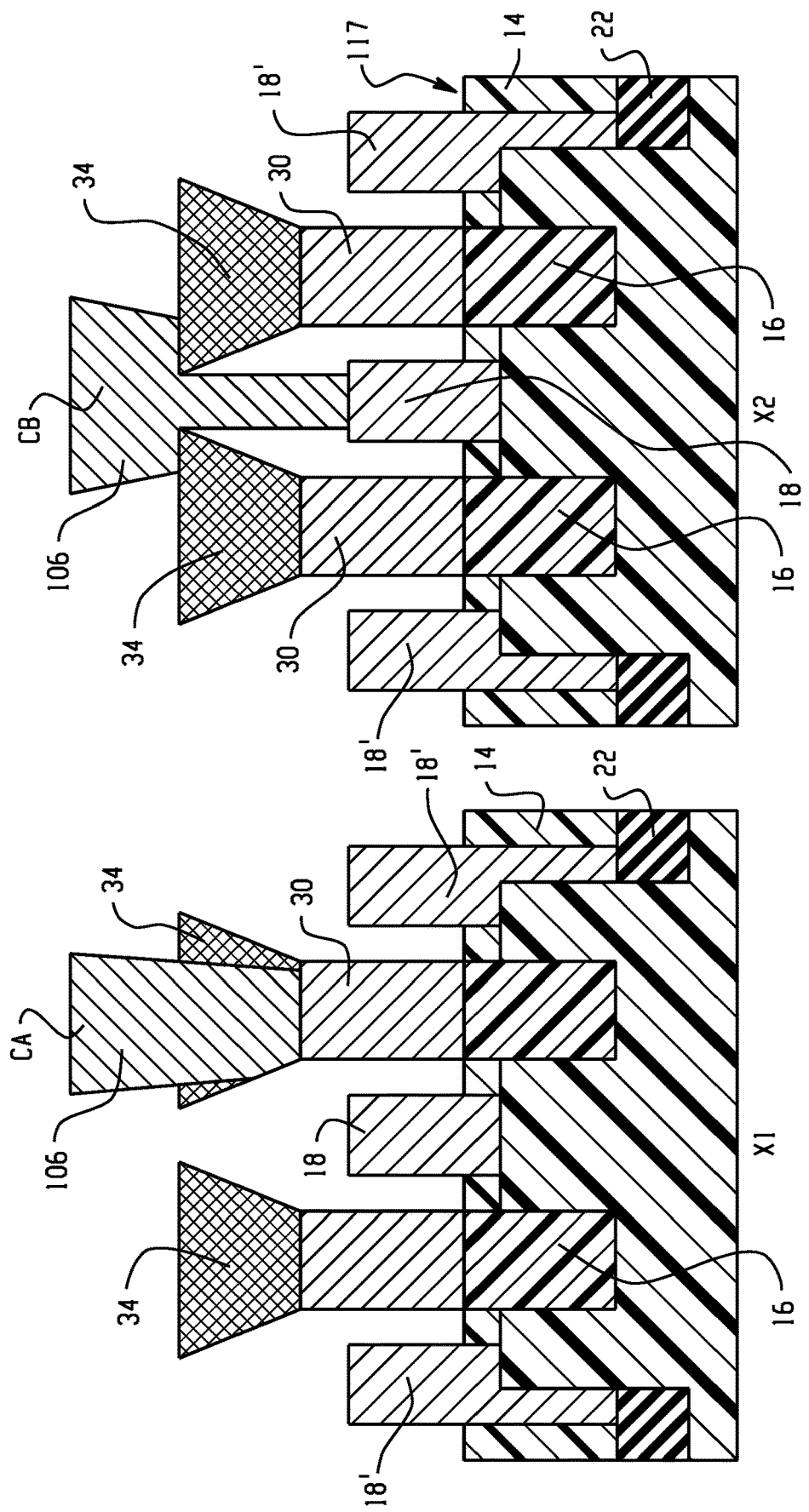
FIG. 14 depicts the cross-sectional views X1 and X2 of FIG. 13 after SAC cap material removal in accordance with one or more embodiments of this invention.

FIG. 14 illustrates a cross sectional view of the transistor device 10 subsequent to SAC cap 14 removal to the source and drain regions 16 so as to form a bottom spacer layer 117. As shown, the trapezoidal shaped SiC cap 34 protects the metal plug (TS) 30 during selective removal of the SAC cap material 14.

Figure 15:
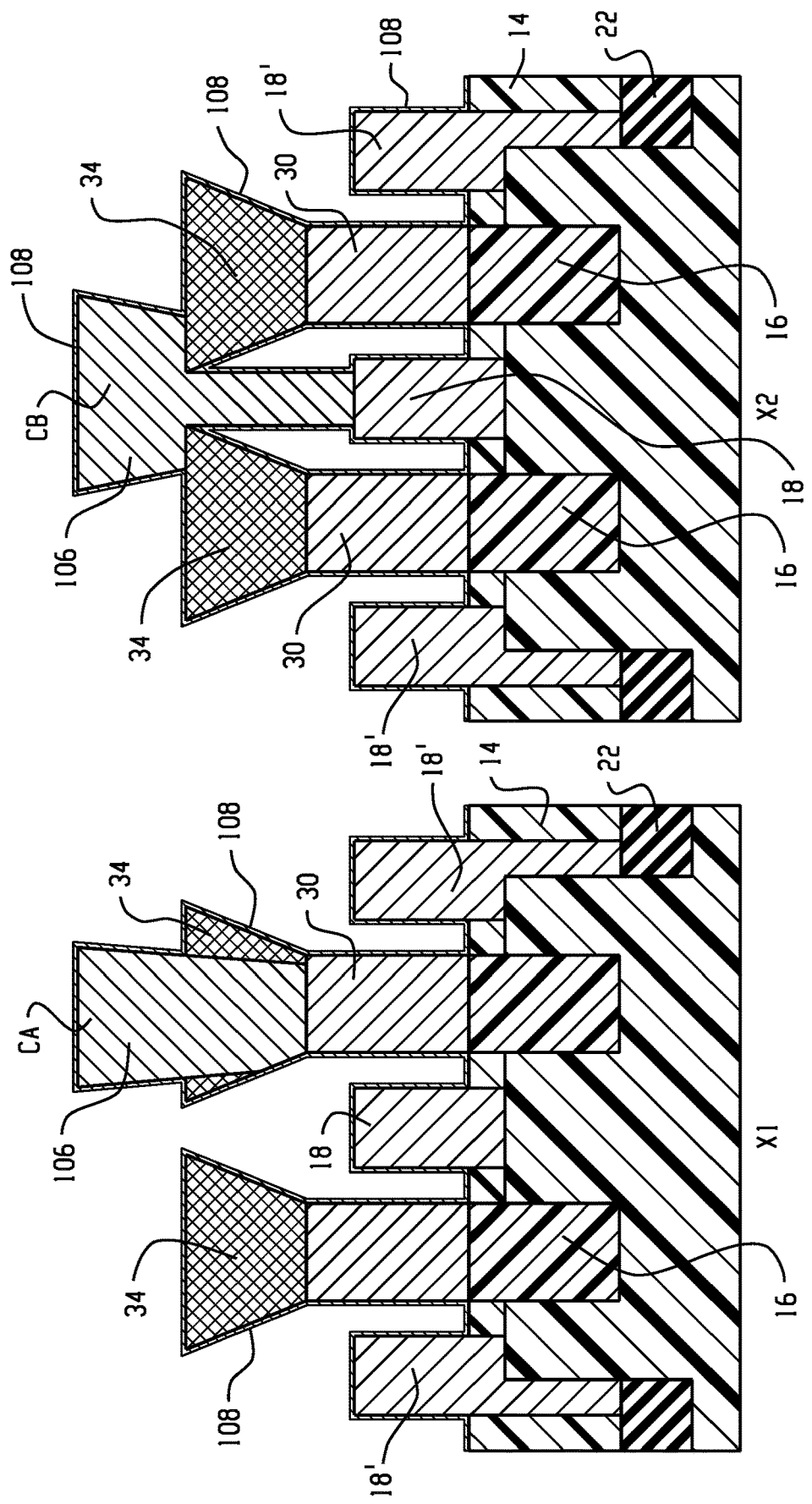
FIG. 15 depicts the cross-sectional views X1 and X2 of FIG. 14 after protective layer deposition onto exposed surfaces of the device in accordance with one or more embodiments of this invention.

FIG. 15 illustrates a cross sectional view of the transistor device 10 subsequent to atomic layer deposition (ALD) of a thin protective layer 108 onto the exposed surfaces of the device.

Figure 16:
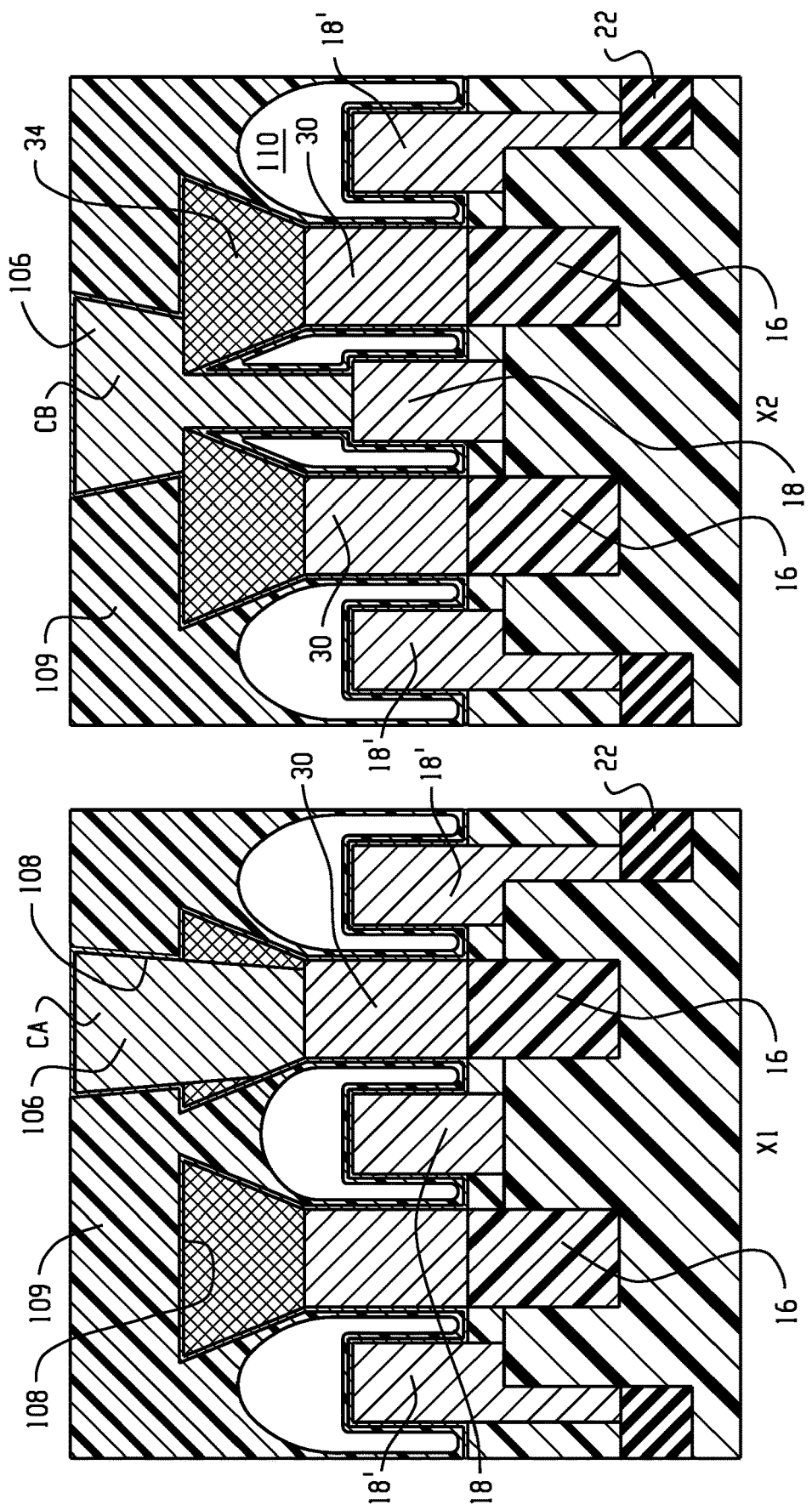
FIG. 16 depicts the cross-sectional views X1 and X2 of FIG. 15 after low k dielectric deposition and formation of a continuous airgap in the SAC cap and sidewall spacers in accordance with one or more embodiments of this invention.

In FIG. 16, a low k dielectric material 109 is deposited and subsequently planarized to the sacrificial material filled contact openings (CB) and (CA) using a chemical mechanical planarizing process to form a planar surface. The deposition process is configured to provide pinch off of the interlayer dielectric such that a continuous airgap 110 is formed in the sidewall spacers and the cap material over the replacement metal gate electrodes 18'. The small and re-entrant opening helps continuous airgap formation for the SAC cap and sidewall spacer. In the active region, the u-shaped airgap breaks in the gate contact (CBoA) to the gate 18 as shown. The presence of the continuous airgap about the replacement gate electrodes 18', and the discontinuous airgap only about the gate contact 18 over the active area (CBoA) maximizes parasitic capacitance reduction.

Figure 17:
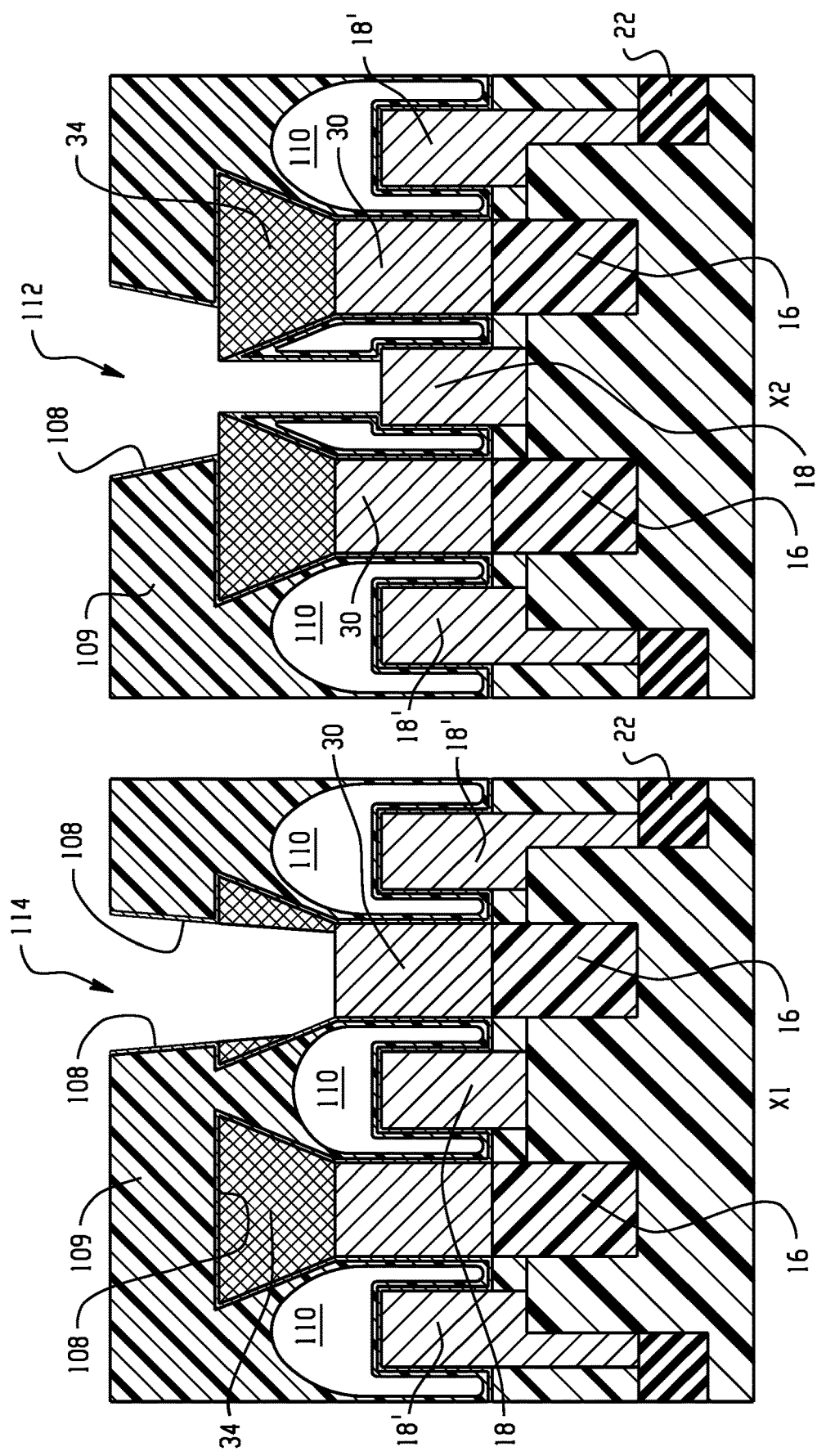
FIG. 17 depicts the cross-sectional views X1 and X2 of FIG. 16 after removal of the sacrificial material from the filled openings corresponding to CA and CB in accordance with one or more embodiments of this invention.

In FIG. 17, the sacrificial material 106 in the filled contact openings (CB) and (CA) is selectively removed to form openings 112, 114 to the gate electrode 18 and to the metal plug 30 of a source and drain region 16, respectively.

Figure 18:
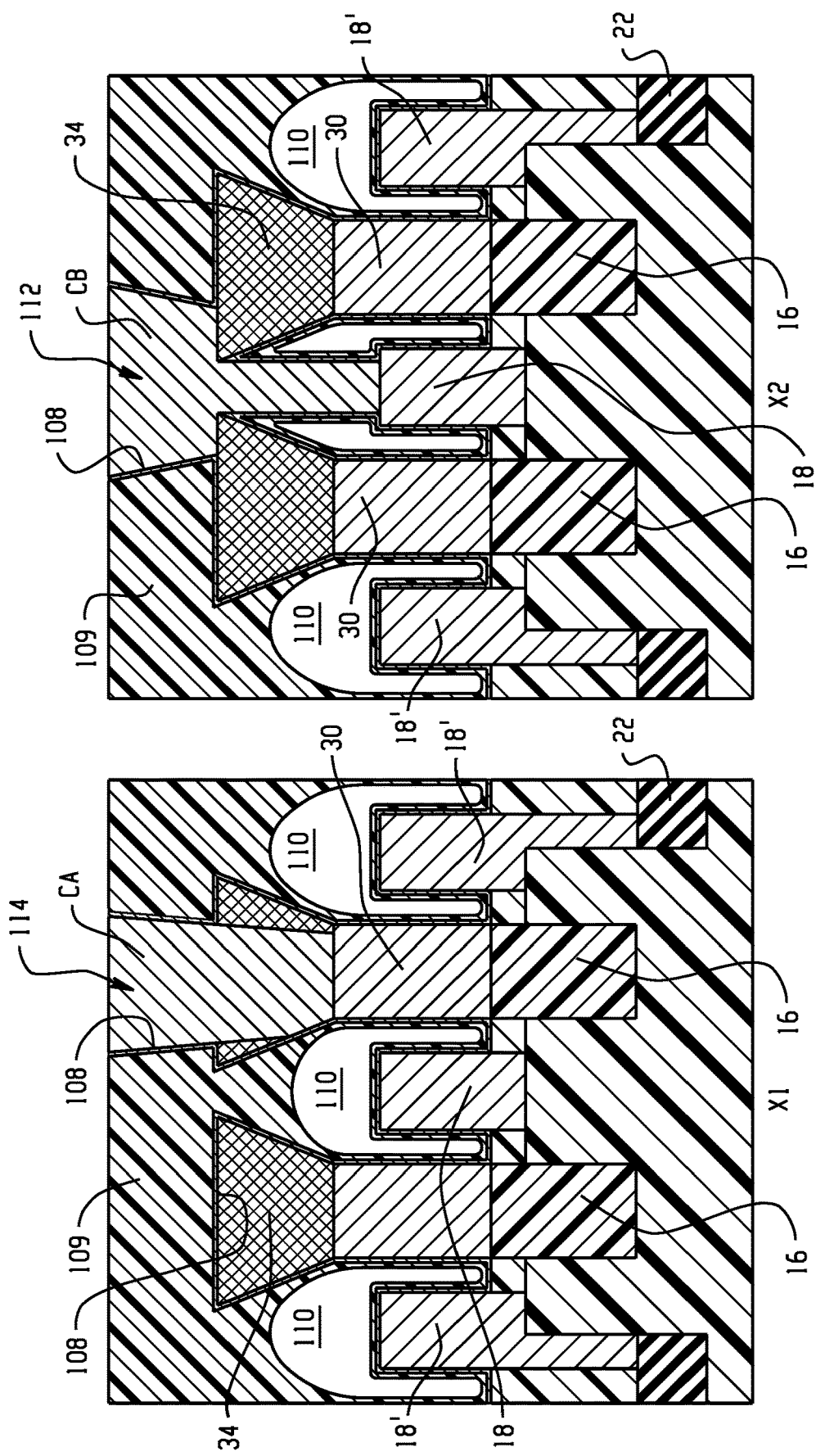
FIG. 18 depicts the cross-sectional views X1 and X2 of FIG. 17 after CA and CB metallization of in accordance with one or more embodiments of this invention.

In FIG. 18, the openings 112, 114 are metallized with a metal 114 to form the gate contact (CB) and source and drain contact (CA). The metal can be selected from the group consisting of copper, cobalt, tungsten, ruthenium and the like.

Referring now to FIGS. 19-26, there are depicted fabrication operations to form the continuous airgap in accordance with one or more alternative embodiments of this invention subsequent to the partial fabrication of the transistor device 10 previously shown in FIG. 1. As will be described in greater detail below, the fabrication operations include deposition and patterning of a bilayer SAC cap to form the self-aligned contact gate (CB) and self-aligned source drain contacts (CA).

Figure 19:
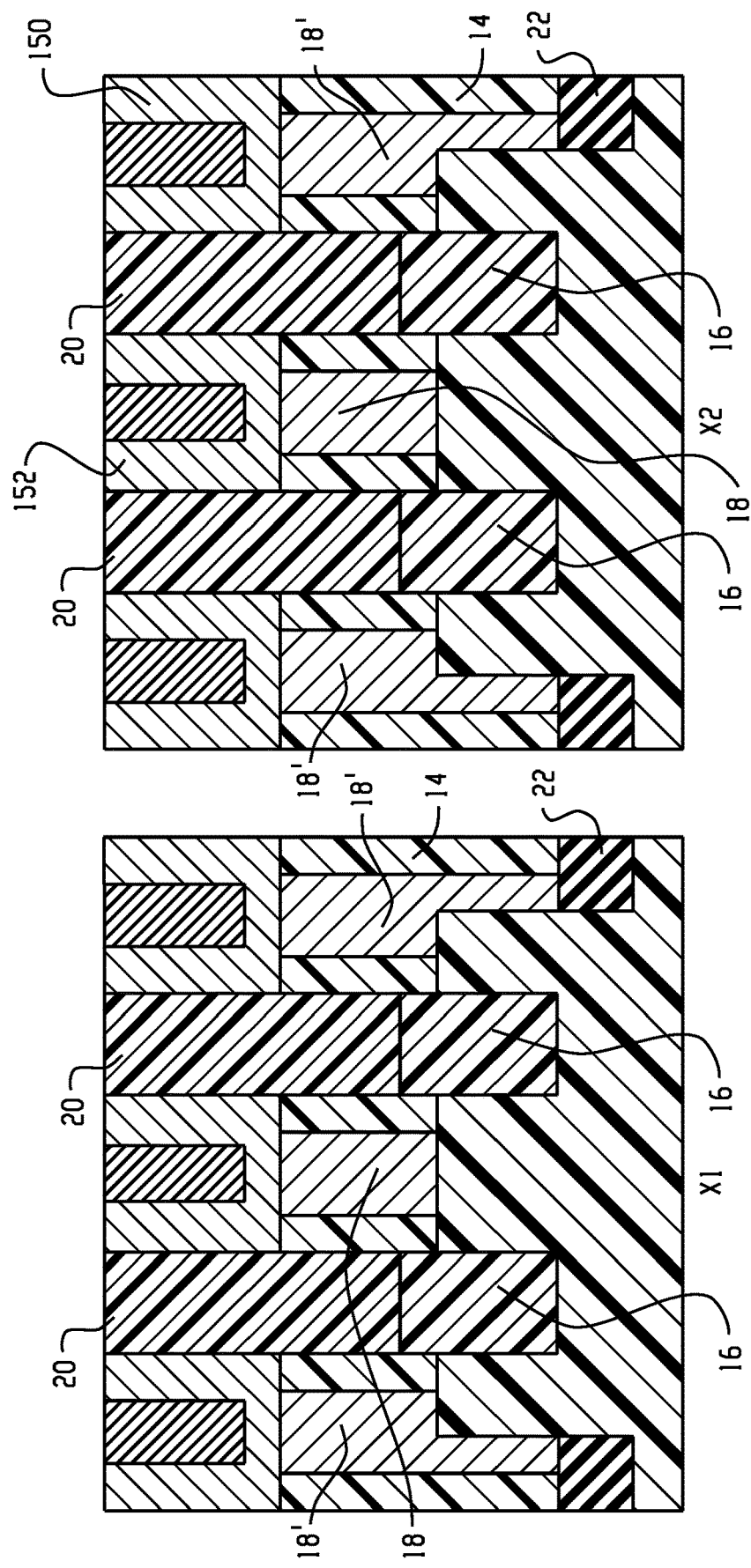
FIG. 19 depicts a top plan view and cross-sectional views taken along lines X1 and X2 where the source and drain contact (CA) and gate contact (CB) will be formed and illustrating a partial transistor structure after formation of a bilayer self-aligned contact (SAC) cap in accordance with one or more embodiments of this invention.

Turning now to FIG. 19, a top plan view and cross-sectional views taken along lines X1 and X2 where the source and drain contact (CA) and gate contact (CB) will be formed and illustrating a partial transistor structure after formation of a bilayer self-aligned contact (SAC) cap is shown. The bilayer self-aligned contact (SAC) cap includes a first SAC cap layer 14 and a second cap layer 150 on the first SAC cap layer 14. The second SAC layer 150 is lithographically patterned to form trench openings aligned with the gate electrodes 18, which are then filled with material e.g., SiBCN, to form filled trench openings 152. The bilayer SAC cap includes a planar top surface, which can be formed using a planarization process such as by chemical mechanical planarization.

Figure 20:
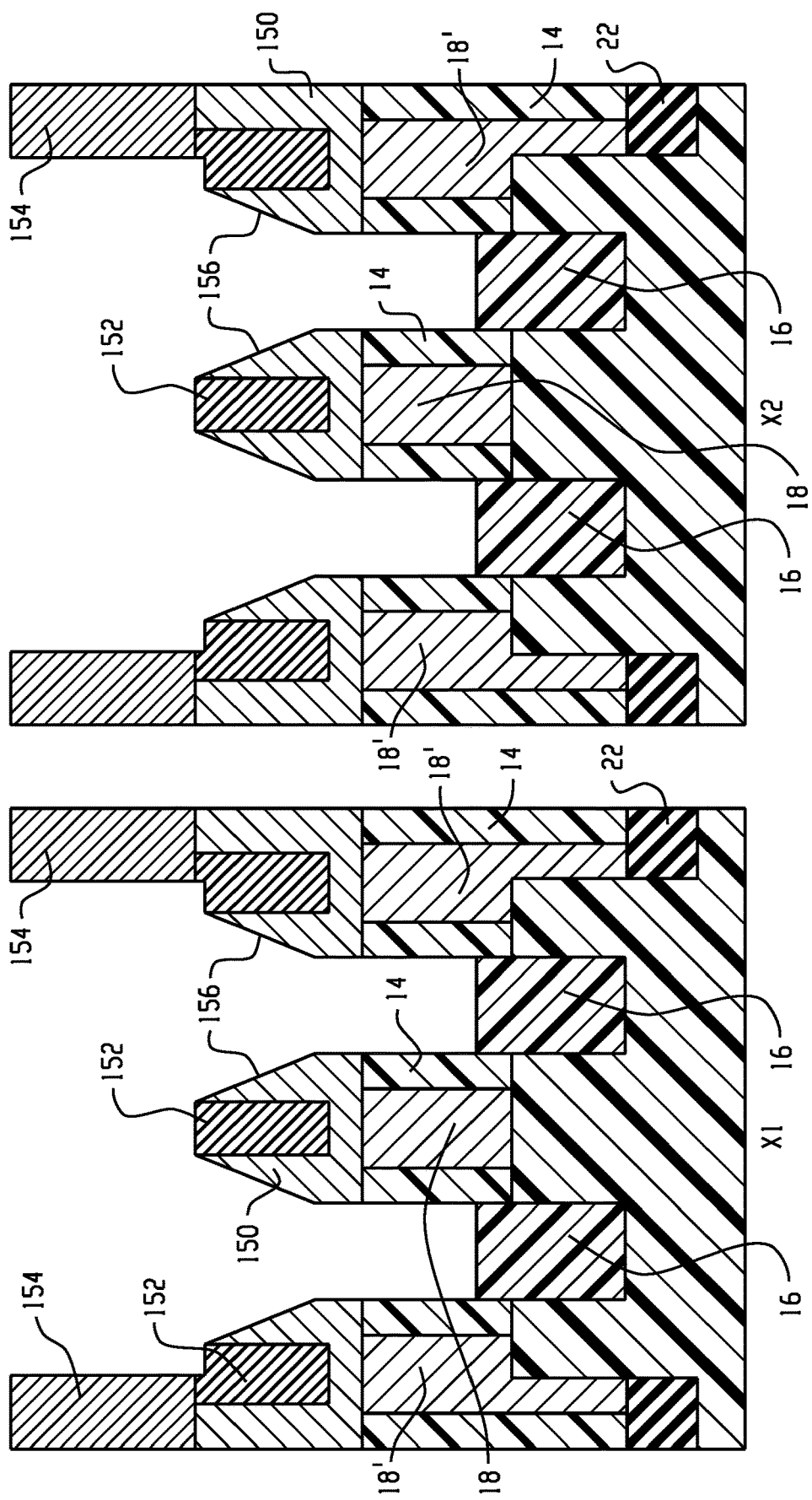
FIG. 20 depicts the cross-sectional views X1 and X2 of FIG. 19 after a metal plug (i.e., trench silicide, (TS)) etch process in accordance with one or more embodiments of this invention.

FIG. 20 depicts the cross-sectional views X1 and X2 of FIG. 19 after a metal plug (i.e., trench silicide, (TS)) etch process. An organic planarization layer 154 can be deposited and utilized as a block mask to form openings to the source and drain regions 16 within the device 10. The TS etch process is configured to provide sloped sidewalls 156 in the SAC cap 150 as shown.

Figure 21:
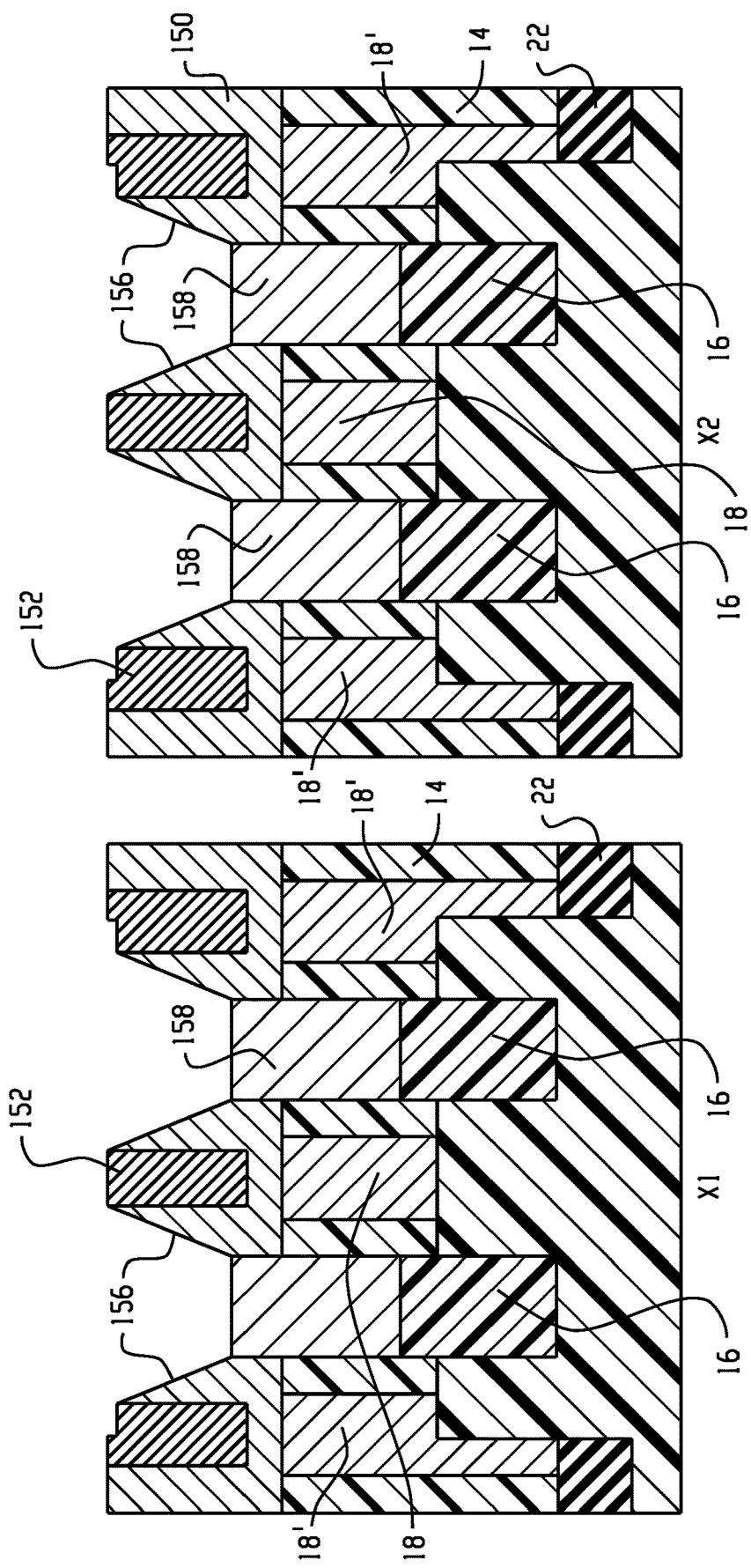
FIG. 21 depicts the cross-sectional views X1 and X2 of FIG. 20 after deposition and patterning of a planarizing layer in accordance with one or more embodiments of this invention.

FIG. 21 depicts the cross-sectional views X1 and X2 of FIG. 20 after deposition and patterning of a planarizing layer 158 into the openings corresponding to the source and drain regions 16. The thickness of the planarizing layer 158 can vary and generally provides a height at about the inflection point defined by the sloped sidewall portion 156.

Figure 22:
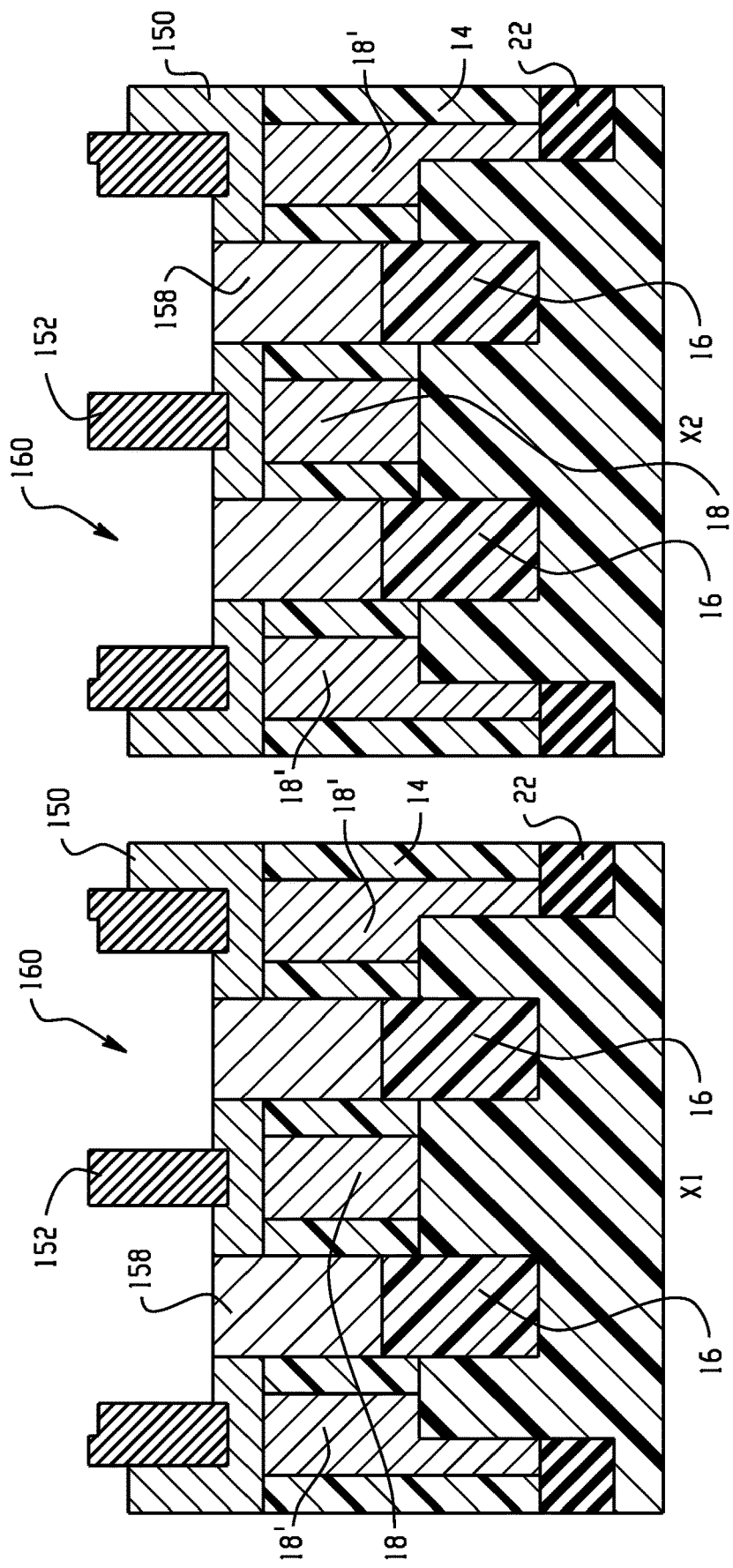
FIG. 22 depicts the cross-sectional views X1 and X2 of FIG. 21 after selective removal of the SAC cap material corresponding to an outer spacer about the gate electrodes in accordance with one or more embodiments of this invention.

FIG. 22 depicts the cross-sectional views X1 and X2 of FIG. 21 after selective removal of the second SAC cap material 150 in the bilayer corresponding to an outer spacer about the filled trench openings 152. The selective removal results in rectangular shaped openings 160 between adjacent SiC filled trench openings 152 152 in the SAC cap material 150.

Figure 23:
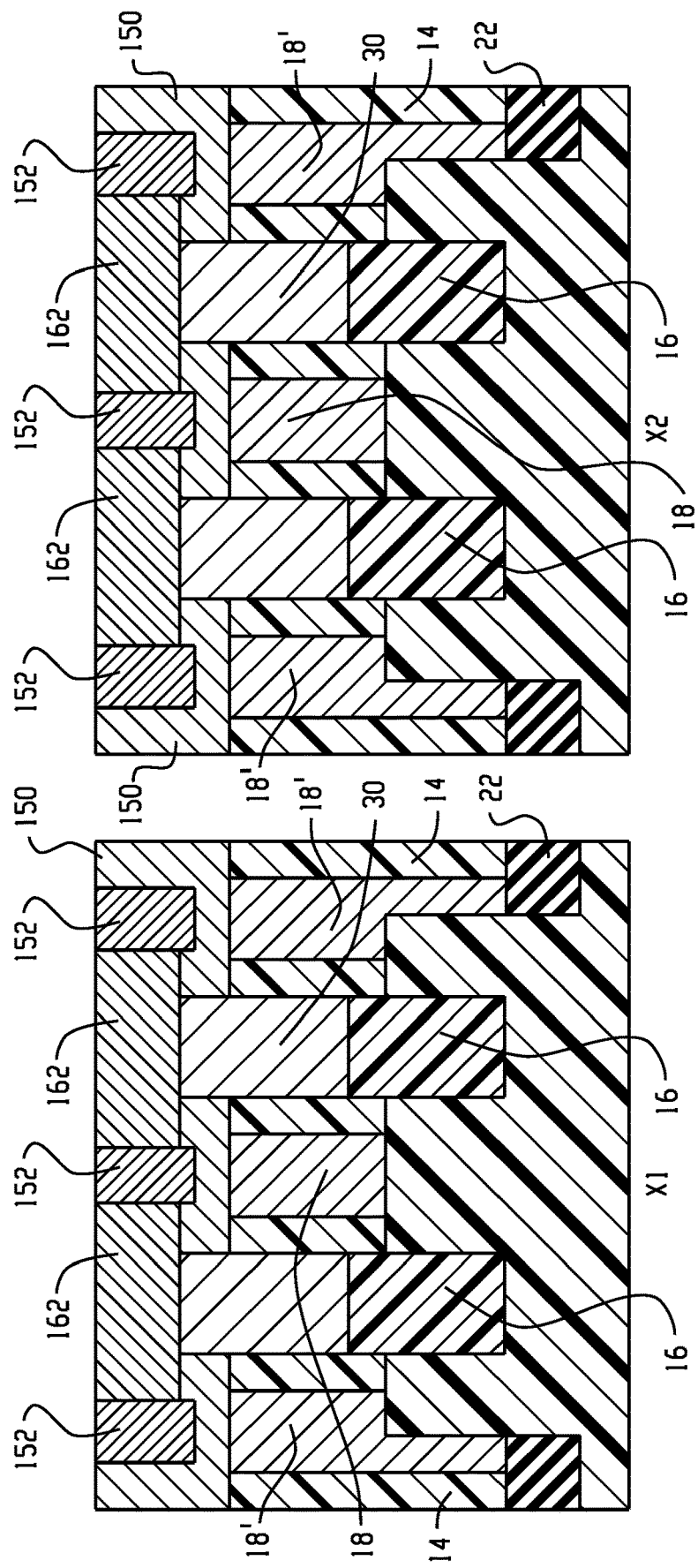
FIG. 23 depicts the cross-sectional views X1 and X2 of FIG. 22 after metal plug (TS) cap formation in accordance with one or more embodiments of this invention.

FIG. 23 depicts the cross-sectional views X1 and X2 of FIG. 22 after deposition of a TS cap material 162 in the rectangular shaped opening 160. As will be apparent, the TS cap formation between the SiC filled trench openings 152 and the width of the SiC filled trench openings 152 can be used to generate a relatively small CBoA contact opening to the gate electrode 18 over the active area.

Figure 24:
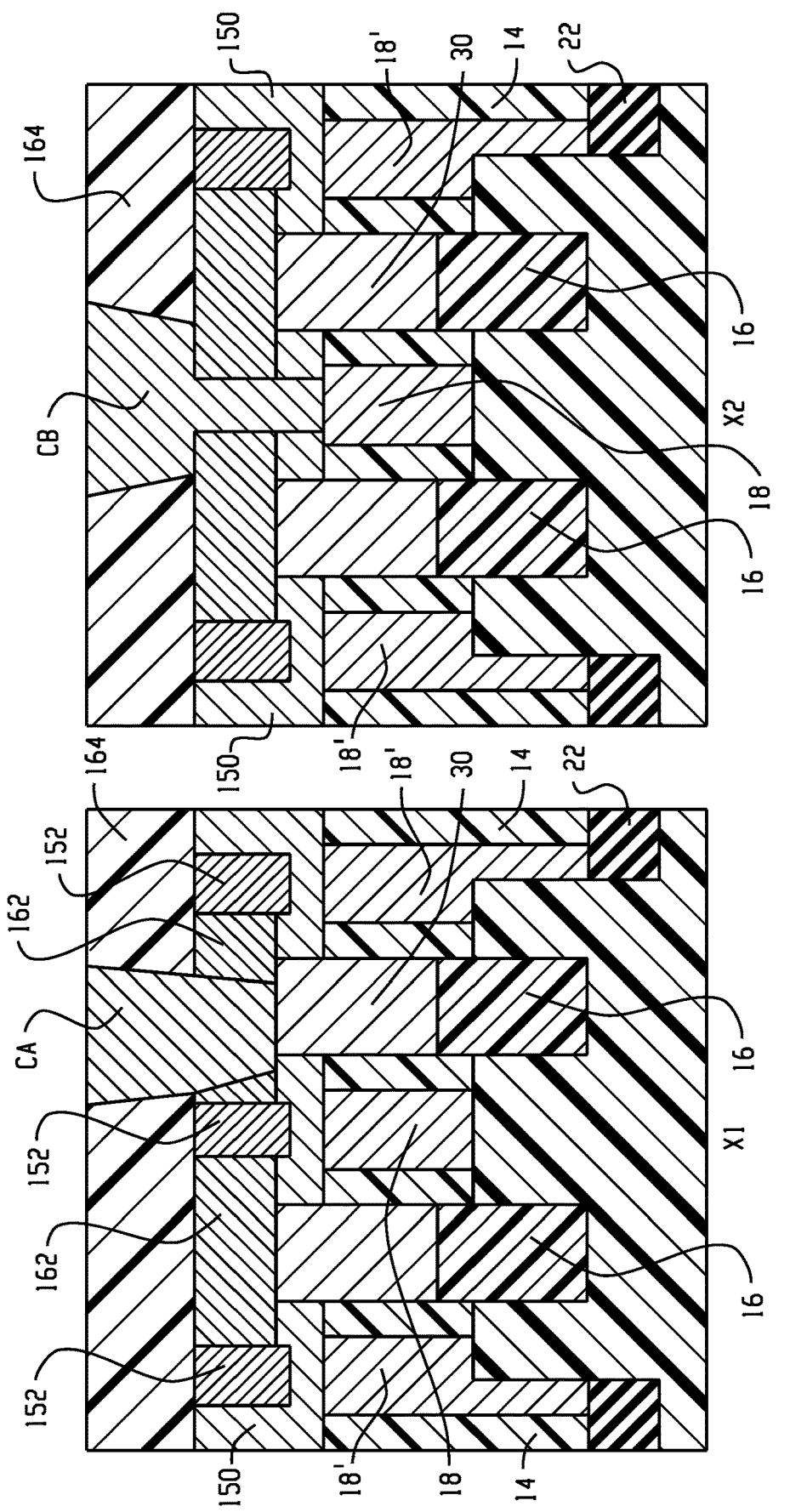
FIG. 24 depicts the cross-sectional views X1 and X2 of FIG. 23 after subsequent to formation and metallization of the self-aligned CA and CB contacts in accordance with one or more embodiments of this invention.

FIG. 24 depicts the cross-sectional views X1 and X2 of FIG. 23 after subsequent to formation and metallization of the self-aligned CA and CB contacts. A sacrificial interlayer dielectric material 164 can be deposited and lithographically patterned to form the openings for the self-aligned CA and CB contacts, which are subsequently filled with a desired conductive metal.

Figure 25:
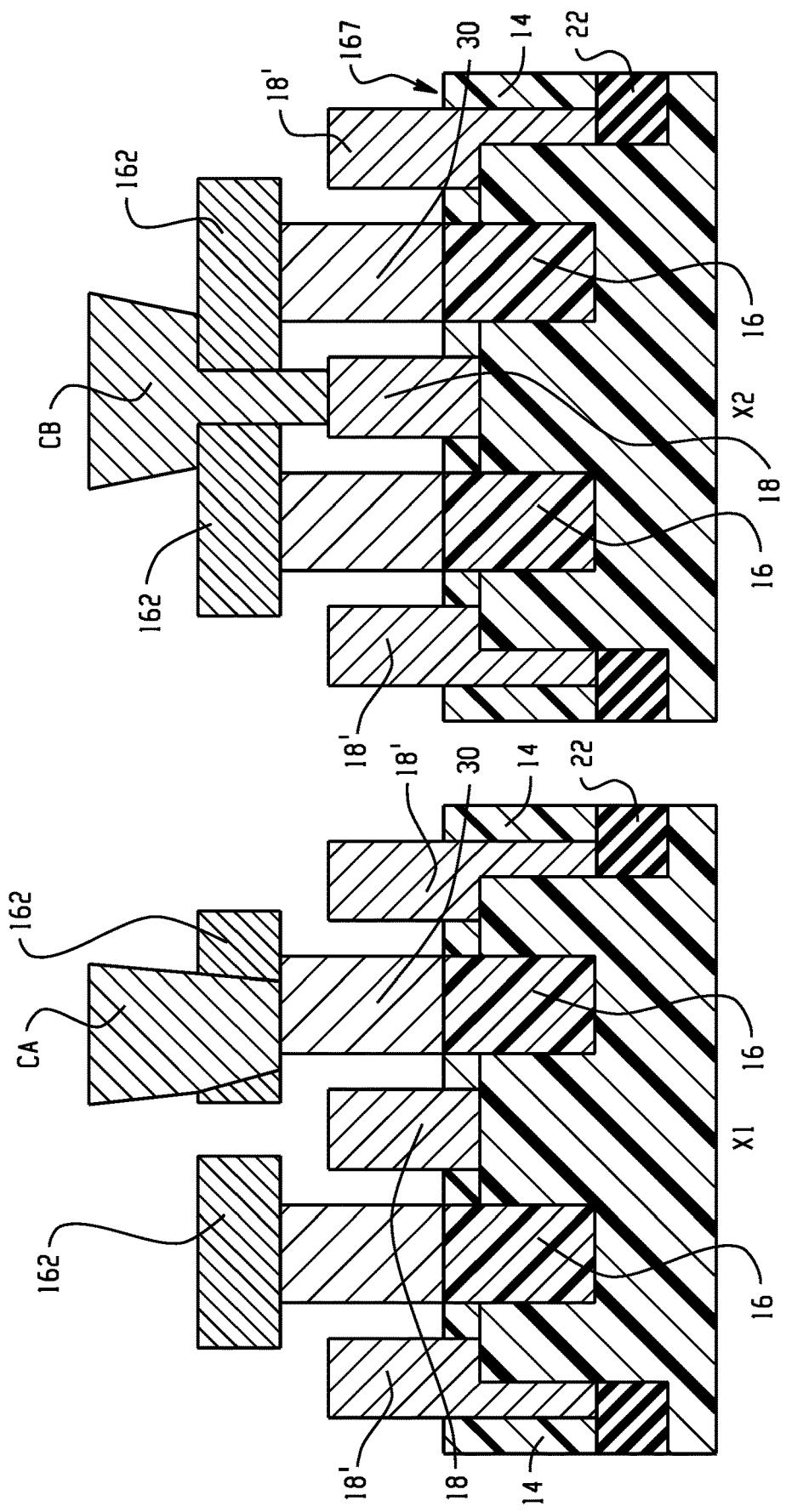
FIG. 25 depicts the cross-sectional views X1 and X2 of FIG. 24 after removal of the sacrificial interlayer dielectric, the SAC Cap material, and the spacer in accordance with one or more embodiments of this invention.

FIG. 25 depicts the cross-sectional views X1 and X2 of FIG. 24 after selective removal of the sacrificial interlayer dielectric material 164, the bilayer SAC cap materials 14, and 150, and the SiC filled trench openings 152 to the source and drain regions 16 so as to form a bottom spacer layer 167. As shown, the rectangular shaped TS cap 162 cap helps protect the metal plug (TS) 30 during the selective removal process.

Figure 26:
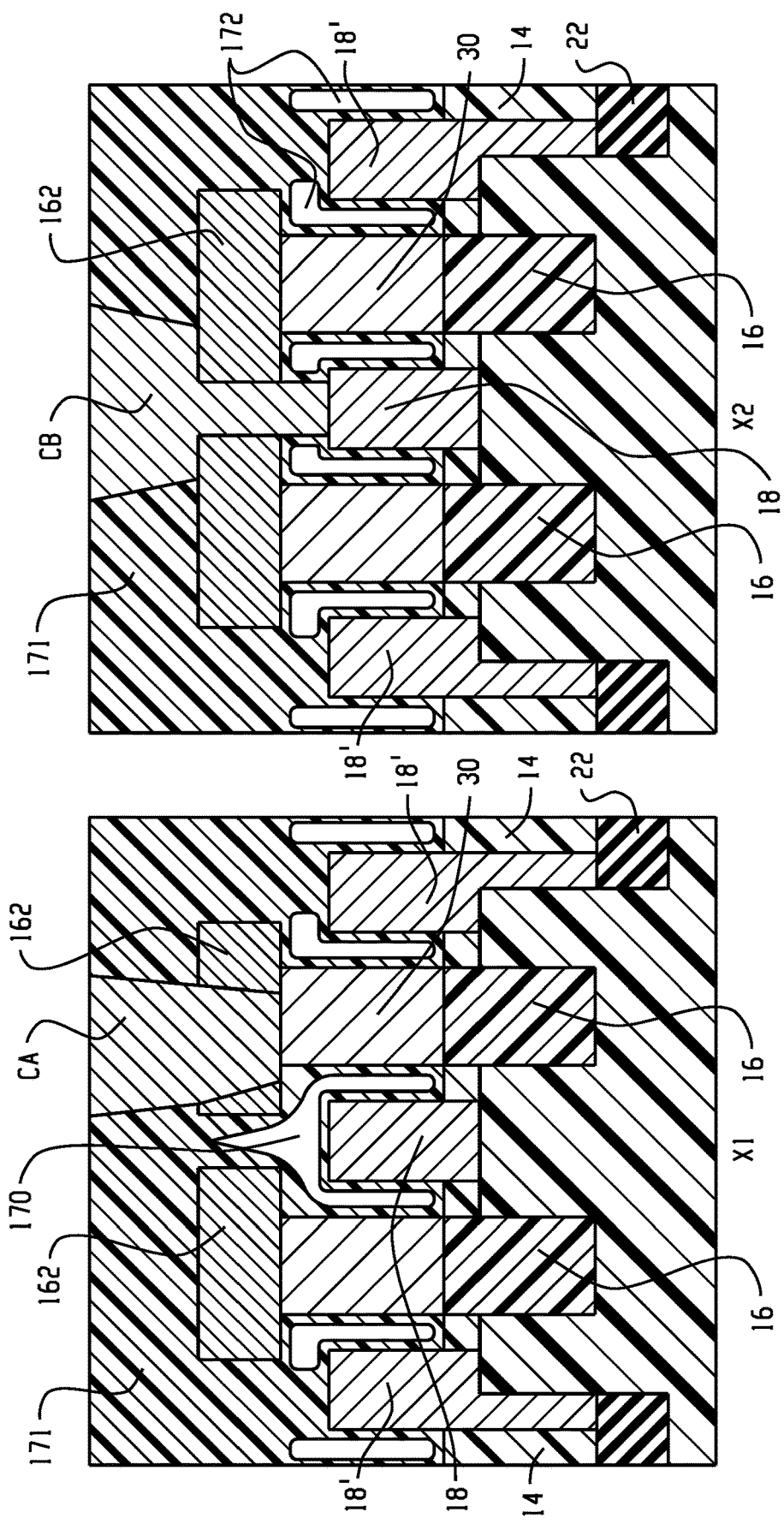
FIG. 26 depicts the cross-sectional views X1 and X2 of FIG. 25 after low k dielectric deposition and formation of a continuous airgap in the SAC cap and sidewall spacers in accordance with one or more embodiments of this invention.

FIG. 26 depicts the cross-sectional views X1 and X2 of FIG. 25 after deposition of a low k dielectric material 171 and formation of a continuous airgap 170 and a discontinuous airgap 172 about the CBoA and at edges of the active area. The deposition process is configured to provide pinch off to form the continuous and discontinuous airgaps 170, 172. In the active region and at the edges of the active region, the u-shaped airgap breaks, e.g., in the gate contact (CBoA) to the gate 18 as shown and at the edges of the active area, i.e., the airgap is discontinuous from sidewall to sidewall. The continuous and discontinuous airgaps 170, 172 can significantly reduce parasitic capacitance.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a device structure, the method comprising:
   forming an opening including a lower portion and a trapezoidal-shaped upper portion in a first sacrificial cap material to source and drain regions;
   metallizing the lower portion to form metal plugs conductively coupled to the source and drain regions;
   filling the trapezoidal-shaped upper portions with a second sacrificial cap material;
   forming a self-aligned contact opening (CA) to at least one of the metal plugs over the source and drain regions and a self-aligned contact opening over an active area of a gate structure (CBoA);
   metallizing the self-aligned contact opening to form a contact area and a gate structure contact area over the active area conductively coupled to the source and drain regions, and the gate structure, respectively;
   selectively removing the first sacrificial cap material from top surfaces of the source and drain regions; and
   depositing a low k dielectric material to form a continuous airgap extending from between sidewalls and above the gate structure.

2. The method of claim 1, wherein the continuous airgap has an inverted U-shape.

3. The method of claim 1, wherein forming the self-aligned contact opening (CA) to the at least one of the metal plugs includes directionally etching through the second sacrificial cap material in the trapezoidal-shaped upper portions.

4. The method of claim 1, wherein forming the self-aligned contact opening to the gate structure (CBoA) includes directionally etching through the first sacrificial cap material between adjacent to the filled trapezoidal-shaped upper portions.

5. The method of claim 1, further comprising: removing the first sacrificial cap material in an amount effective to form a bottom spacer layer.

6. The method of claim 1, wherein the gate structure comprises a replacement metal gate structure.

7. An integrated circuit structure comprising:
   a gate structure formed adjacent to a semiconductor body at a channel region, wherein the channel region is positioned laterally between source/drain regions;
   metal plugs formed on the source/drain regions;
   trapezoidal-shaped plug caps formed above and immediately adjacent to the metal plugs;
   a self-aligned metal filled contact conductively coupled to one of the metal plugs on the source/drain regions;
   a self-aligned metal filled contact formed over an active area conductively coupled to the gate structure; and
   a low k dielectric layer comprising a continuous airgap having an inverted U-shape formed around the gate structure and breaks at about a portion of the gate structure including the self-aligned metal filled contact.

8. The integrated circuit structure of claim 7, wherein the self-aligned metal filled contact conductively coupled to the gate structure is self-aligned to and has a width about equal to a distance between adjacent trapezoidal-shaped plug caps.

9. The integrated circuit structure of claim 7, further comprising a protective layer on surfaces intermediate the low k dielectric layer and the gate structure, the metal plugs, a metal plug cap, and a bottom isolation layer.

10. The integrated circuit structure of claim 9, wherein the metal plug cap comprises SiC.

11. The integrated circuit structure of claim 7, wherein the continuous airgap in a region including the self-aligned metal filled contact is enclosed by a metal plug cap, the metal plugs, the gate structure, and a gate contact.

12. The integrated circuit structure of claim 7, further comprising one or more replacement metal gate structures, wherein the continuous airgap has the inverted U-shape formed about the replacement metal gate structure.

13. The integrated circuit structure of claim 7, wherein the trapezoidal-shaped plug caps above and immediately adjacent to the metal plugs define a space therebetween, wherein the self-aligned metal filled contact is self-aligned to the space.

14. The integrated circuit structure of claim 7, wherein the source/drain regions are raised relative to the fin and formed of an epitaxial semiconductor material.

15. An integrated circuit structure comprising:
   a gate structure formed adjacent to a semiconductor body at a channel region, wherein the channel region is positioned laterally between source/drain regions;
   metal plugs formed on the source/drain regions;
   rectangular-shaped plug caps formed above and immediately adjacent to the metal plugs;
   a self-aligned metal filled contact (CA) conductively coupled to one of the metal plugs on the source/drain regions;

a self-aligned metal filled contact formed over an active area (CBoA) between adjacent rectangular shaped plug caps conductively coupled to the gate structure in the active area; and a dielectric spacer comprising a continuous airgap having an inverted U-shape formed around the gate structure when the rectangular-shaped plug caps are adjacent to one another and breaks at an edge of the active area and about a portion of the gate structure including the self-aligned metal filled contact.

16. The integrated circuit structure of claim 15, wherein the self-aligned metal filled contact conductively coupled to the gate structure is self-aligned to and has a width equal to a distance between adjacent rectangular-shaped plug caps.

17. The integrated circuit structure of claim 15, further comprising a discontinuous airgap in the active area enclosed by the rectangular shaped plug caps, the metal plugs, the gate structure, and a gate contact.

18. The integrated circuit structure of claim 15, wherein the source/drain regions are raised relative to the fin and formed of an epitaxial semiconductor material.

19. The integrated circuit structure of claim 15, wherein the continuous airgap formed in a region including the CBoA is enclosed by a metal plug cap, the metal plugs, the gate structure, and a gate contact.

20. The integrated circuit structure of claim 15, further comprising one or more replacement metal gate structures, wherein the continuous airgap has the inverted U-shape formed around the replacement metal gate structure.

\* \* \* \* \*